(12) United States Patent
Ushikubo et al.

(10) Patent No.: US 10,522,777 B2
(45) Date of Patent: Dec. 31, 2019

(54) DISPLAY DEVICE WITH CAP LAYER

(71) Applicant: Japan Display Inc., Tokyo (JP)

(72) Inventors: Takahiro Ushikubo, Tokyo (JP); Norihisa Maeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/730,162

(22) Filed: Oct. 11, 2017

(65) Prior Publication Data

US 2018/0123068 A1 May 3, 2018

(30) Foreign Application Priority Data

Oct. 27, 2016 (JP) .................. 2016-210298

(51) Int. Cl.
| | |
|---|---|
| *H01L 51/50* | (2006.01) |
| *H01L 27/32* | (2006.01) |
| *H01L 51/52* | (2006.01) |
| *H01L 51/00* | (2006.01) |
| *H01L 29/08* | (2006.01) |
| *H01L 35/24* | (2006.01) |

(52) U.S. Cl.
CPC ........ *H01L 51/504* (2013.01); *H01L 27/3244* (2013.01); *H01L 51/5064* (2013.01); *H01L 51/5092* (2013.01); *H01L 51/5253* (2013.01); *H01L 51/5265* (2013.01)

(58) Field of Classification Search
CPC ............. H01L 51/5265; H01L 27/3211; H01L 27/3244; H01L 51/504; H01L 51/5064; H01L 51/5092; H01L 51/5076; H01L 27/3246

USPC ........................................ 257/40, 98; 438/29
See application file for complete search history.

(56) References Cited

U.S. PATENT DOCUMENTS

| | | | |
|---|---|---|---|
| 7,608,991 B2 | 10/2009 | Abe et al. | |
| 2006/0103929 A1* | 5/2006 | Morisawa ................ | G02B 5/22 |
| | | | 359/452 |
| 2016/0043154 A1* | 2/2016 | Choi .................... | H01L 27/3258 |
| | | | 257/40 |
| 2016/0104868 A1* | 4/2016 | Kang .................. | H01L 51/5275 |
| | | | 257/40 |
| 2016/0133880 A1* | 5/2016 | Lee ..................... | H01L 51/5281 |
| | | | 257/40 |

(Continued)

FOREIGN PATENT DOCUMENTS

| | | |
|---|---|---|
| JP | 2006-173092 A | 6/2006 |
| JP | 2008-218081 A | 9/2008 |
| JP | 2012-038555 A | 2/2012 |

*Primary Examiner* — Nduka E Ojeh
(74) *Attorney, Agent, or Firm* — Michael Best & Friedrich LLP

(57) ABSTRACT

Provided is a display device having a first pixel and a second pixel adjacent to the first pixel. The first pixel includes a first pixel electrode, a first EL layer over the first pixel electrode, and a second electrode over the first EL layer. The second pixel includes a second pixel electrode, a second EL layer over the second pixel electrode, and the second electrode over the second EL layer. The display device further possesses a first cap layer over the second electrode, a second cap layer over the first cap layer and overlapping with the first EL layer, and a third cap layer covering the second cap layer, overlapping with the first EL layer and the second EL layer, and in contact with the first cap layer in a region overlapping with the second EL layer.

20 Claims, 15 Drawing Sheets

(56) References Cited

U.S. PATENT DOCUMENTS

| | | | |
|---|---|---|---|
| 2016/0155979 A1* | 6/2016 | Yim | H01L 51/5275 |
| | | | 257/40 |
| 2016/0197308 A1* | 7/2016 | Jeong | H01L 51/5275 |
| | | | 257/40 |
| 2016/0240589 A1* | 8/2016 | Jeong | H01L 27/322 |
| 2016/0276421 A1* | 9/2016 | Lee | H01L 27/3272 |
| 2017/0104036 A1* | 4/2017 | Maeda | H01L 27/3211 |
| 2017/0330923 A1* | 11/2017 | Chung | H01L 27/124 |
| 2018/0053918 A1* | 2/2018 | Woo | H01L 51/5284 |
| 2018/0182823 A1* | 6/2018 | Ito | H01L 51/5256 |

* cited by examiner

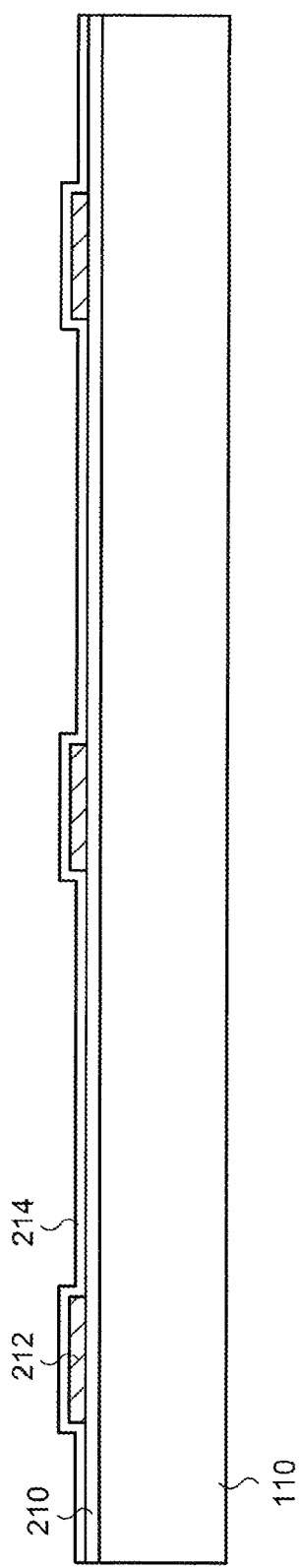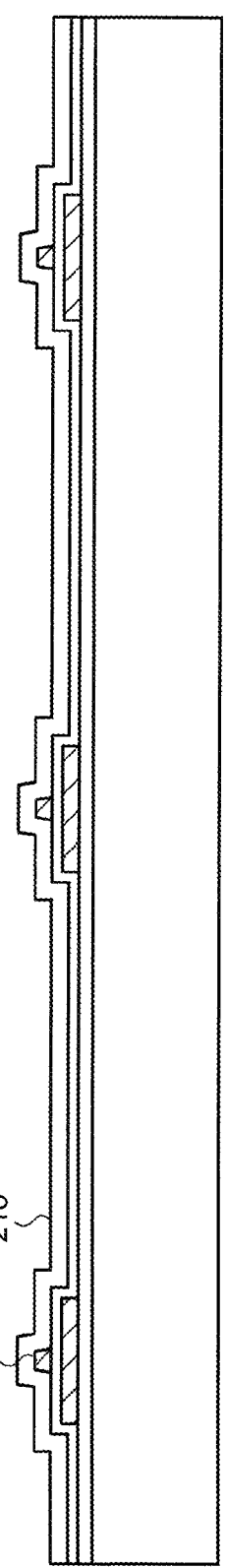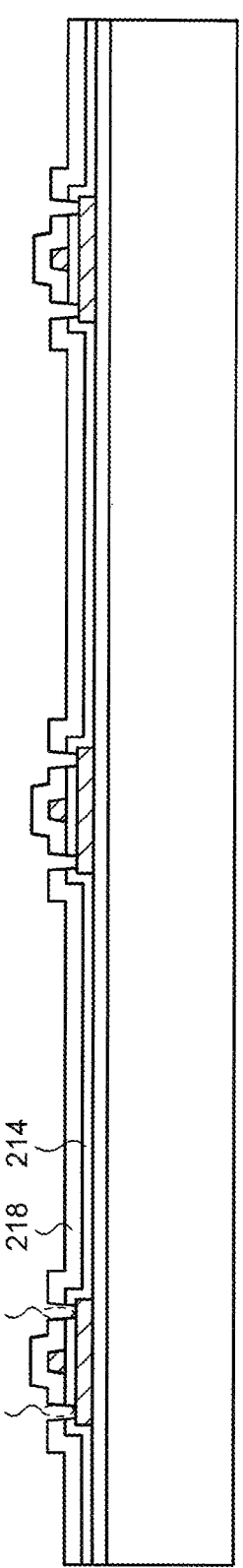

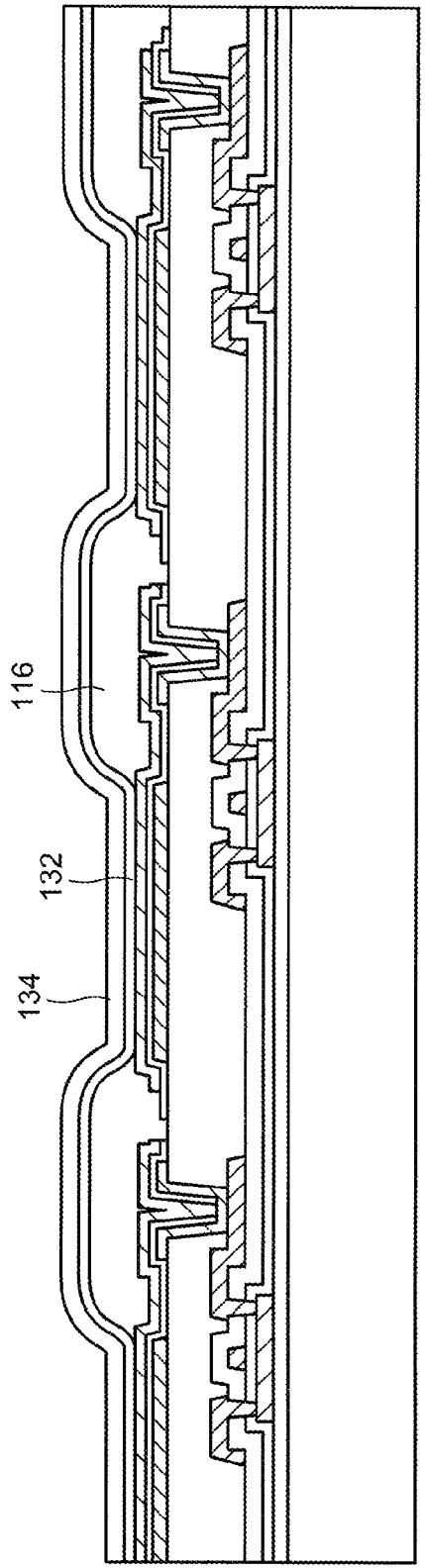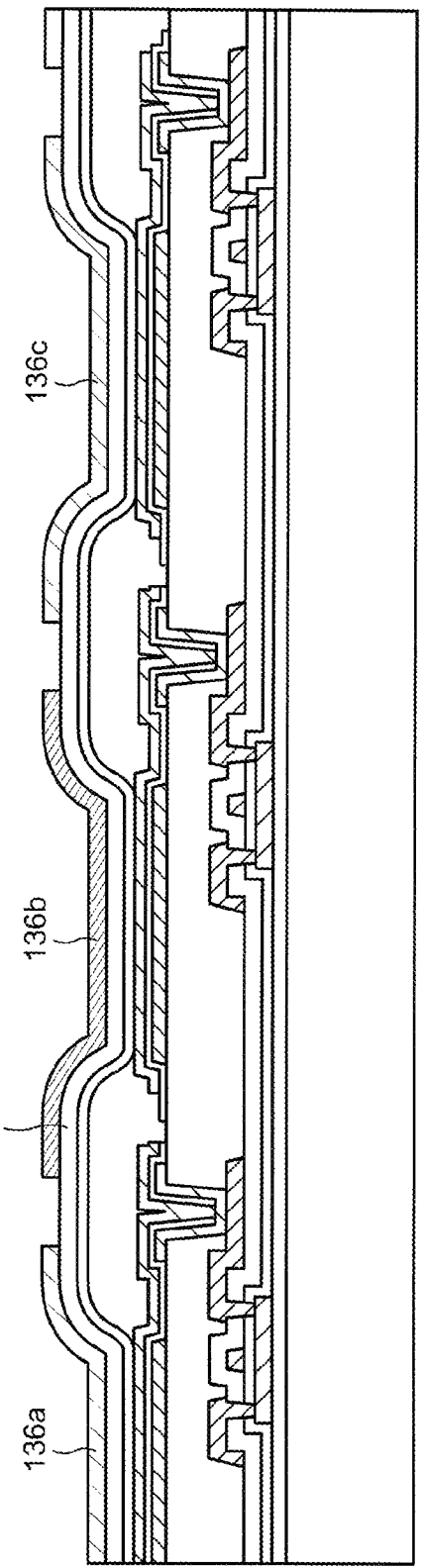

DISPLAY DEVICE WITH CAP LAYER

CROSS REFERENCE TO RELATED APPLICATIONS

This application is based on and claims the benefit of priority from the prior Japanese Patent Application No. 2016-210298, filed on Oct. 27, 2016, the entire contents of which are incorporated herein by reference.

FIELD

An embodiment of the present invention relates to a light-emitting element, a display device including the light-emitting element, and a manufacturing method of the display device.

BACKGROUND

An organic EL (Electroluminescence) display device is represented as an example of a display device. An organic EL display device has an organic light-emitting element (hereinafter, referred to as a light-emitting element) in each of a plurality of pixels formed over a substrate. A light-emitting element has a layer (hereinafter, referred to as an organic layer or an EL layer) including an organic compound between a pair of electrodes (cathode and anode) and is operated by supplying current between the pair of electrodes. A color provided by a light-emitting element is mainly determined by a light-emitting material in an EL layer, and light emission with a variety of colors can be obtained by appropriately selecting a light-emitting material. Arrangement of a plurality of light-emitting elements giving different colors on a substrate makes it possible to reproduce a full-color image.

An emission color and emission intensity of a light-emitting element can be also controlled by utilizing a light-interference effect in and outside the light-emitting element. For example, in Japanese patent application publications No. 2012-38555, 2008-218081, and 2006-173092, light-emission generated in an EL layer is resonated and amplified between a pair of electrodes and the light extracted from the EL layer is further resonated and amplified in an optical adjustment layer in contact with one of the pair of electrodes, by which the emission color is adjusted and the emission intensity is controlled.

SUMMARY

An embodiment of the present invention is a display device having a first pixel and a second pixel adjacent to the first pixel. The first pixel includes a first pixel electrode, a first EL layer over the first pixel electrode, and a second electrode over the first EL layer. The second pixel includes a second pixel electrode, a second EL layer over the second pixel electrode, and the second electrode over the second EL layer. The display device further possesses a first cap layer over the second electrode, a second cap layer over the first cap layer and overlapping with the first EL layer, and a third cap layer covering the second cap layer, overlapping with the first EL layer and the second EL layer, and in contact with the first cap layer in a region overlapping with the second EL layer.

An embodiment of the present invention is a display device having a first pixel, a second pixel adjacent to the first pixel, and a third pixel adjacent to the second pixel. The first pixel includes a first pixel electrode, a first EL layer over the first pixel electrode, and a second electrode over the first EL layer. The second pixel includes a second pixel electrode, a second EL layer over the second pixel electrode, and the second electrode over the second EL layer. The third pixel includes a third pixel electrode, a third EL layer over the third pixel electrode, and the second electrode over the third EL layer. The display device further possesses a first cap layer over the second electrode, a second cap layer over the first cap layer and overlapping with the first EL layer, and a third cap layer covering the second cap layer, overlapping with the first EL layer, the second EL layer, and the third EL layer, and in contact with the first cap layer in a region overlapping with the third EL layer.

BRIEF DESCRIPTION OF DRAWINGS

FIG. 8A to FIG. 8C are schematic cross-sectional views for explaining a manufacturing method of a display device according to an embodiment of the present invention;

FIG. 11A and FIG. 11B are schematic cross-sectional views for explaining a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by performing etching or light irradiation on one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" to be in contact with the "other structure" and a case where the structure is arranged over the "other structure" with an additional structure therebetween.

First Embodiment

1. Outline Structure

Figure 1:
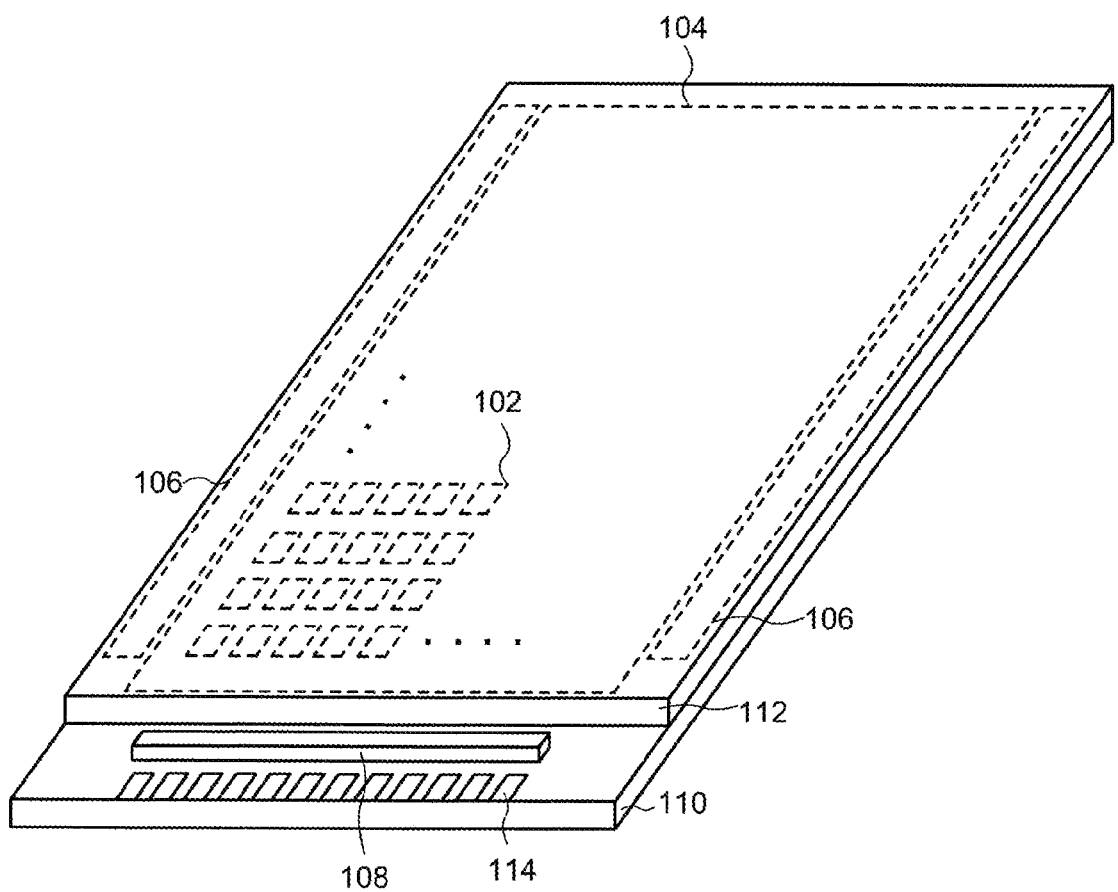
FIG. 1 is a schematic perspective view of a display device according to an embodiment of the present invention.

A schematic perspective view of a display device 100 according to an embodiment of the present invention is shown in FIG. 1. The display device 100 has, over one surface (top surface) of a substrate 110, a plurality of pixels 102 arranged in a row direction and a column direction, a display region 104 structured by the plurality of pixels 102, scanning-line driver circuits 106, and a data-line driver circuit 108. A variety of signals for driving the pixels 102 is input from an external circuit (not shown) to the scanning-line driver circuits 106 and the data-line driver circuit 108 through a connector such as a flexible printed circuit (FPC) connected to terminals 114 disposed over the substrate. Each pixel 102 is controlled on the basis of these signals so that an image is reproduced on the display region 104.

One or both of the scanning-line driver circuits 106 and the data-line driver circuit 108 may not be necessarily formed over the substrate 110 directly, and driver circuits formed over a substrate (e.g., semiconductor substrate) different from the substrate 110 may be arranged over the substrate 110 or the connector and each pixel 102 may be controlled by these driver circuits. In FIG. 1, an example is illustrated where the display region 104 and the scanning-line driver circuits 106 formed over the substrate 110 are covered by an opposing substrate 112, while the data-line driver circuit 108 prepared over another substrate is mounted over the substrate 110.

2. Light-Emitting Element

Figure 2:
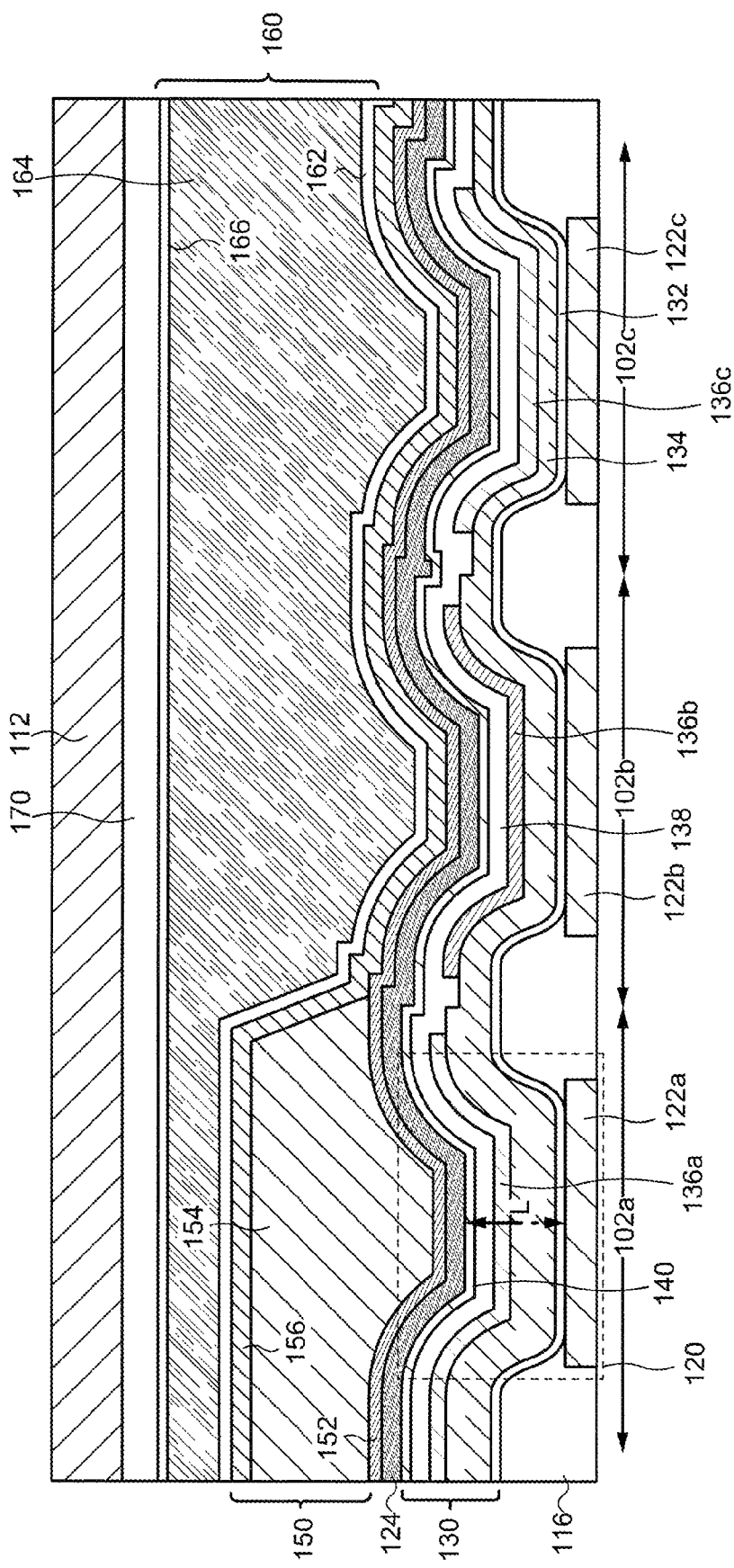
FIG. 2 is a schematic cross-sectional view of a display device according to an embodiment of the present invention.

A schematic cross-sectional view of the display device 100 is shown in FIG. 2. In this cross-sectional view, three pixels 102a, 102b, and 102c of the plurality of pixels 102 of the display device 100 are illustrated. The pixel 102b is adjacent to and sandwiched by the pixel 102a and the pixel 102c. The substrate 110 for supporting the pixels 102 and a variety of circuits for driving the pixels 102 are omitted in FIG. 2.

A light-emitting element 120 is provided to each pixel 102. Each light-emitting element 120 possesses a first electrode (hereinafter, referred to as a pixel electrode) 122, a second electrode (also called a common electrode) 124, and an EL layer 130 sandwiched therebetween. Here, the pixels 102a, 102b, and 102c have pixel electrodes 122a, 122b, and 122c, respectively. The pixel electrodes 122a, 122b, and 122c are electrically separated from one another and independently applied with a potential on the basis of the signals from the data-line driver circuit 108.

Edge portions of the pixel electrodes 122a, 122b, and 122c are covered by a partition wall 116, and depressions and projections caused by a thickness of the pixel electrodes 122 are relieved by the partition wall 116. The partition wall 116 is an insulating film formed over the display region 104 so as to expose the pixel electrodes 122. Therefore, the partition wall 116 can be regarded as one insulating film having a plurality of opening portions, and each opening portion overlaps with the respective pixel electrode 122.

The second electrode 124 is disposed over the plurality of pixels 102a, 102b, and 102c. Therefore, the second electrode 124 is shared by the plurality of pixels 102a, 102b, and 102c and supplies a common potential to the plurality of light-emitting elements 120.

The pixel electrode 120 and the second electrode 124 are configured so that one of them transmits visible light and the other reflects visible light. One of the pixel electrode 120 and the second electrode 124 functions as an anode, and the other serves as a cathode. In the present embodiment, an example is explained in which the pixel electrode 122 serves as an anode reflecting visible light and the second electrode 124 functions as a semi-transparent and semi-reflective cathode partly transmitting and partly reflecting visible light. In this case, the pixel electrode 122 can be formed by using a metal having a high reflectance, such as silver and aluminum, or an alloy thereof. Alternatively, a film of a conductive oxide with a light-transmitting property may be formed over a film including the metal or the alloy. Indium-tin oxide (ITO), indium-zinc oxide (IZO), and the like are exemplified as a conductive oxide. As the second electrode 124, it is possible to use a metal thin film including a metal such as aluminum, magnesium, and silver or an alloy thereof and having a thickness which allows visible light to transmit therethrough. Alternatively, a conductive oxide with a light-transmitting property, such as ITO and IZO, may be used. When the metal thin film is employed as the second electrode 124, a conductive oxide with a light-transmitting property may be stacked over the metal thin film.

A structure of the EL layer 130 may be arbitrarily determined, and the EL layer 130 may be structured with a plurality of layers having different functions. The EL layer 130 of the light-emitting element 120 shown in FIG. 2 has a hole-injection layer 132, a hole-transporting layer 134, an emission layer 136, an electron-transporting layer 138, and an electron-injection layer 140. Each layer may have a single-layer structure or may be formed with stacked layers of different materials. Alternatively, the EL layer 130 may not include all of these layers and may further contain a layer with another function. For example, the EL layer 130 may include a hole-blocking layer, an electron-blocking layer, an exciton-blocking layer, and the like. Alternatively, one layer may have functions of two layers.

A potential difference is provided between the pixel electrode 122 and the second electrode 124, by which holes and electrodes are injected to the EL layer 130 from the former and latter, respectively. Holes are transported to the emission layer 136 through the hole-injection layer 132 and the hole-transporting layer 134. Electrons are transported to the emission layer 136 through the electron-injection layer 140 and the electron-transporting layer 138. Holes and electrons are recombined in the emission layer 136, giving an excited state of a light-emitting material included in the emission layer 136. When the excited state is relaxed to a ground state, light with a wavelength corresponding to an energy difference between the excited state and the ground state is released and observed as the light emission from the light-emitting element 120.

Hence, a region of the pixel electrode 122 exposed from the opening portion of the partition wall 116 contributes to the injection of holes and is an emission region of each light-emitting element 120. In other words, the emission region of each light-emitting element 120 matches the opening portion of the partition wall 116.

For the hole-injection layer 132, a compound to which holes are readily injected, that is, a compound readily oxidized (i.e., electron-donating compound) can be used. In other words, a compound whose level of the highest occupied molecular orbital (HOMO) is shallow can be used. For example, an aromatic amine such as a benzidine derivative and a triarylamine, a carbazole derivative, a thiophene derivative, a phthalocyanine derivative such as copper phthalocyanine, and the like can be used. Alternatively, a polymer material such as a polythiophene derivative or a polyaniline derivative may be used.

Poly(3,4-ethylenedioxydithiophene)/poly(styrenesulfonic acid) is represented as an example. Alternatively, a mixture of an electron-donating compound such as the aforementioned aromatic amine, carbazole derivative, or aromatic hydrocarbon with an electron acceptor may be used. As an electron acceptor, a transition-metal oxide such as vanadium oxide and molybdenum oxide, a nitrogen-containing heteroaromatic compound, an aromatic compound having a strong electron-withdrawing group such as a cyano group, and the like are represented.

The hole-transporting layer 134 has a function to transport holes injected to the hole-injection layer 132 to the emission layer 136, and a material the same as or similar to the material usable in the hole-injection layer 132 can be used. For example, it is possible to use a material having a deeper HOMO level than that of the hole-injection layer 132 and having a difference in HOMO level from the hole-injection layer 132 by approximately 0.5 eV or less.

The emission layer 136 may be formed with a single compound or have the so-called host-guest type structure. In the case of the host-guest type structure, a stillbene derivative, a condensed aromatic compound such as an anthracene derivative, a carbazole derivative, a metal complex including a ligand having a benzoquinolinol as a basic skeleton, an aromatic amine, a nitrogen-containing heteroaromatic compound such as a phenanthroline derivative, and the like can be used as a host material, for example. A fluorescent material such as a coumarin derivative, a pyran derivative, a quinacridone derivative, a tetracene derivative, a pyrene derivative, and an anthracene derivative, or a phosphorescent material such as an iridium-based orthometal complex can be used as a guest. When the emission layer 136 is configured with a single compound, the aforementioned host material can be used.

The electron-transporting layer 138 has a function to transport electrons injected from the second electrode 124 through the electron-injection layer 140 to the emission layer 136. For the electron-transporting layer 138, a compound readily reduced (i.e., electron-accepting compound) can be used. In other words, a compound whose level of the lowest unoccupied molecular orbital (LUMO) is deep can be used. For example, a metal complex including a ligand having a benzoquinolinol as a basic skeleton, such as tris(8-quinolinolato)aluminum and tris(4-methyl-8-quinolinolato)aluminum, a metal complex including a ligand having an oxathiazole or thiazole as a basic skeleton, and the like are represented. In addition to these metal complexes, a compound with an electron-deficient heteroaromatic ring, such as an oxadiazole derivative, a thiazole derivative, a triazole derivative, and a phenanthroline derivative, can be used.

For the electron-injection layer 140, a compound which promotes electron injection to the electron-transporting layer 138 from the second electrode 124 can be used. For example, a mixture of a compound usable in the electron-transporting layer 138 with an electron-donating material such as lithium or magnesium can be used. Alternatively, an inorganic compound such as lithium fluoride and calcium fluoride may be used.

Each layer included in the EL layer 130 may be formed by applying a wet-type film-forming method such as an ink-jet method, a spin-coating method, and a printing method or a dry-type film-forming method such as an evaporation method.

In FIG. 2, the layers other than the emission layer 136 of the EL layer 130, that is, the hole-injection layer 132, the hole-transporting layer 134, the electron-transporting layer 138, and the electron-injection layer 140 are continuously formed through the pixels 102a, 102b, and 102c and shared by the pixels 102a, 102b, and 102c. On the other hand, the emission layer 136 is formed pixel-by-pixel in the pixels 102a, 102b, and 102c. The use of such a structure allows the pixels 102a, 102b, and 102c to have the emission layers (136a, 136b, and 136c) having light-emitting materials different from one another, by which emission colors different from one another can be produced. For example, when the emission layers 136a, 136b, and 136c include light-emitting materials respectively giving blue, green, and red emissions, full-color display can be achieved by extracting three primary colors from the pixels 102a, 102b, and 102c. In the example shown in FIG. 2, the emission layers 136a, 136b, and 136c are not in contact with one another, and the hole-transporting layer 134 and the electron-transporting layer 138 are in contact with each other over the partition wall 116. However, the emission layers 136a, 136b, and 136c may be formed so as to overlap with one another over the partition wall 116.

The layers other than the emission layer 136 may have different structures or the same structure between the pixels 102a, 102b, and 102c. For example, as shown in FIG. 2, the display device 100 may be configured so that a thickness of the hole-transporting layer 134 is different between the pixels 102a, 102b, and 102c. Alternatively, although not shown, a thickness or a stacking structure of the hole-injection layer 132 and the electron-transporting layer 138 may be different between the pixels.

3. Resonance in Light-Emitting Element

As described above, the EL layers 130 may have different structures between the pixels 102a, 102b, and 102c. Thus, an appropriate resonance structure can be provided to each light-emitting element 120 by controlling a thickness of the EL layer 130. This resonance structure is also called a microcavity. The light-emission from the EL layer 130 is reflected by the pixel electrode 122, and simultaneously partly passes through and is partly reflected by the second electrode 124. The light reflected by the second electrode 124 is reflected again by the pixel electrode 122. The reflected light interferes with each other between the pixel electrode 122 and the second electrode 124, and is then extracted through the second electrode 124.

In this case, light with a wavelength consistent with an optical distance of the light-emitting element 120 is amplified while repeating the reflection, whereas light with a wavelength inconsistent with the optical distance is attenuated. For example, in the case of the light directed perpendicularly to the pixel electrode 122, the optical distance depends on a distance between a reflection surface of the pixel electrode 122 and a reflection surface of the second electrode 124. When the former is a top surface of the pixel electrode 122 and the latter is a bottom surface of the second electrode 124, the optical distance corresponds to L shown in FIG. 2, and L is a summation of a product of a refractive index by a thickness of each layer of the EL layer 130 because the interference takes place in the EL layer 130. When an odd multiple of one fourth of $\lambda$ ($\lambda/4$) is the same as or close to the optical distance L where $\lambda$ is a wavelength of the light, the light having this wavelength $\lambda$ is consistent with the optical distance L and amplified. On the other hand, when an integral multiple of one second of $\lambda$ ($\lambda/2$), that is, an integral multiple of a half wavelength is the same as or close to the optical distance L, the light having this wavelength $\lambda$ is inconsistent with the optical distance L and attenuated. Accordingly, when the light emitted from the emission layer 136 is centered at a wavelength $\lambda$ (e.g., in the case where an emission peak wavelength is $\lambda$), the thickness of the EL layer 130 is controlled so that the optical distance L is an odd multiple of $\lambda/4$, by which a full-width half-maximum of the emitted light is decreased, color purity is improved, and luminance in a front direction of the light-emitting element 120 is increased.

Hence, the structure of each of the EL layers 130 is adjusted in each of the pixels 102a, 102b, and 102c so as to be consistent with the emission wavelengths of the emission layers 136a, 136b, and 136c, which enables an improvement of color purity of the emitted light and an increase of luminance. For example, as shown in FIG. 2, the optical distance can be adjusted by varying the thickness of the hole-transporting layer 134 between the pixels 102. The display device 100 having the light-emitting element 120 with high color purity of emitted light and increased intensity of front luminance can be obtained by this method.

4. Optical Adjustment Layer

The display device 100 may further possess an optical adjustment layer 150 over the second electrode 124. The optical adjustment layer 150 has a first cap layer 152, a second cap layer 154 over the first cap layer 152, and a third cap layer 156 over the second cap layer 154. The first cap layer 152 may be formed so as to be in contact with the second electrode 124. The third cap layer 156 covers the first cap layer 152 and the second cap layer 154.

Here, the second cap layer 154 is provided so as to overlap with a part of the plurality of pixels 102. In other words, a part of the pixels 102 does not overlap with the second cap layer 154. For example, as shown in FIG. 2, the second cap layer 154 overlaps with the EL layer 130 of the pixel 102a or the emission region thereof, but does not overlap with the EL layers 130 of the pixels 102b and 102c nor the emission regions thereof. Therefore, the first cap layer 152 is spaced from the third cap layer 156 with the second cap layer 154 sandwiched therebetween over the emission region in the pixel 102a. On the other hand, the first cap layer 152 and the third cap layer 156 may be in contact with each other in the emission regions of the pixels 102b and 102c.

The color provided by the pixel 102 (exemplified by the pixel 102a in the present embodiment) whose emission region is covered by the second cap layer 154 may be different from the colors provided by the pixels 102 (exemplified by the pixels 102b and 102c in the present embodiment) whose emission regions are not covered by the second cap layer 154. For example, the emission color of the emission layer 136a of the pixel 102a may be different from those of the emission layers 136b and 136c of the pixels 102b and 102c. The emission wavelength of the emission layer 136a may be longer than those of the emission layers 136b and 136c. In other words, an emission peak wavelength of the emission layer 136a may be longer than those of the emission layers 136b and 136c. For example, the display device 100 may be configured so that the emission layer 136a provides red emission while the emission layers 136b and 136c provide green and blue emissions.

A refractive index and a thickness of the first cap layer 152 can be selected so that both or one of the light emissions of the light-emitting elements 120 of the pixels 102b and 102c is amplified between a top surface and a bottom surface of the first cap layer 152. That is, the refractive index and the thickness of the first cap layer 152 can be selected so that a product (hereinafter, referred to as an optical film thickness) of the refractive index by the thickness is an odd multiple of one fourth of both or one of the emission wavelengths (e.g., emission peak wavelengths) of the light-emitting elements 120 of the pixels 102b and 102c.

For example, the film thickness of the first cap layer 152 is equal to or more than 10 nm and equal to or less than 200 nm. It is preferred that the film thickness of the first cap layer 152 be selected according to individual cases because the optimal value thereof depends on a material of the first cap layer 152, a material and a film thickness of the third cap layer 156, an optical film thickness of the EL layer 130, an emission wavelength of a light-emitting material, and objective color purity of the emission.

The first cap layer 152 may have a high transmissivity and a high refractive index in a visual region. For example, the first cap layer 152 may have a refractive index of 1.7 or 2 or more.

On the other hand, the third cap layer 156 may include a material with a refractive index smaller than that of the first cap layer 152. With this structure, it is possible to increase reflectance at an interface between the first cap layer 152 and the third cap layer 156 for the light directed from the first cap layer 152 to the third cap layer 156. As a result, a microcavity can be formed between the top surface and the bottom surface of the first cap layer 152 to amplify the light in the pixels 102b and 102c.

For example, the film thickness of the third cap layer 156 is equal to or more than 10 nm and equal to or less than 200 nm. It is preferred that the film thickness of the third cap layer 156 be selected according to individual cases because the optimal value thereof depends on a material and a film thickness of the first cap layer 152, a material of the third cap layer 156, an optical film thickness of the EL layer 130, an emission wavelength of a light-emitting material, and objective color purity of the emission.

As a material with a high refractive index, a polymer material with a high refractive index is represented. As a polymer material with a high refractive index, a polymer material including sulfur, halogen, or phosphorus is given, for example. As a polymer including sulfur, a polymer having a substituent such as a thioether, a sulfone, and a thiophene in a main chain or side chain is represented. As a polymer material including phosphorus, a polymer including a phosphorous acid group or a phosphoric acid group in a side chain, a polyphosphazene, and the like are represented. As a polymer material including halogen, a polymer material having bromine or iodine as a substituent. The aforementioned polymer material may be intermolecularly or intramolecularly cross-linked.

An inorganic material may be also used as a material having a high refractive index, and titanium oxide, zirconium oxide, chromium oxide, aluminum oxide, indium oxide, ITO, IZO, lead sulfide, zinc sulfide, silicon nitride, and the like are exemplified. Alternatively, a simple substrate of a Group 14 element such as amorphous silicon may be used.

A mixture of the inorganic material and a polymer material may be used. In this case, the aforementioned polymer may be utilized.

As a material with a low refractive index, a polymer material including fluorine is exemplified. As a polymer material including fluorine, polytetrafluoroethylene, poly(vinylidene fluoride), a polymer having these structures as a basic skeleton, a poly(vinyl ether), a polyimide, a poly(methacrylic ester), a poly(acrylic ester), a polysiloxane having fluorine in a side chain, and the like are given. These polymers may be intermolecularly or intramolecularly cross-linked.

As an inorganic compound with a low refractive index, a metal fluoride such as lithium fluoride, magnesium fluoride, and calcium fluoride, silicon oxide including boron oxide or phosphorus oxide, and the like are represented.

Figure 3:
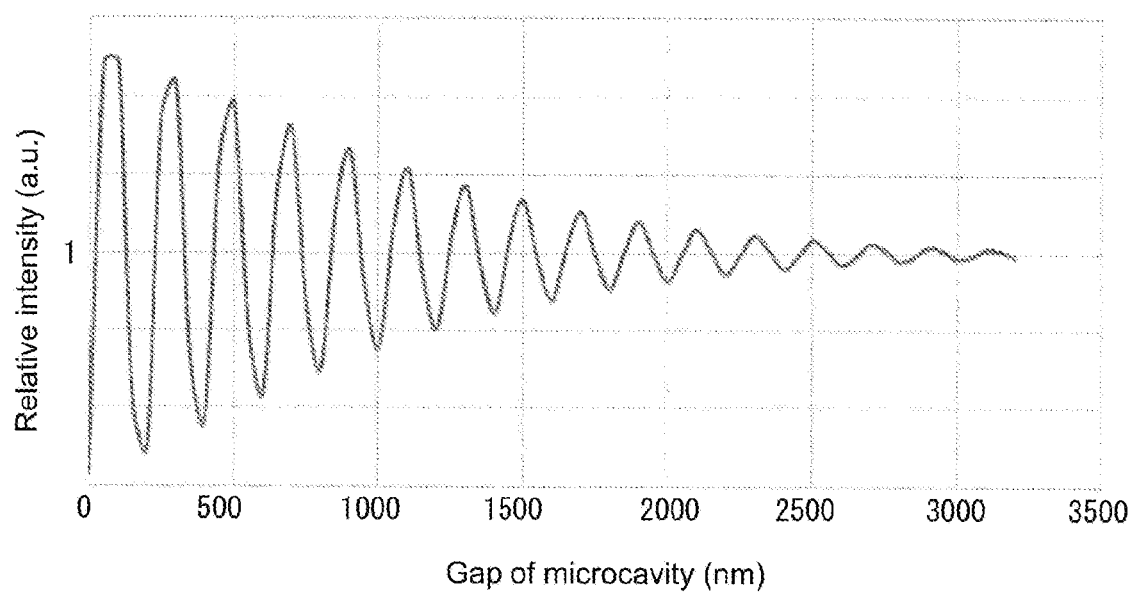
FIG. 3 is a diagram showing the dependence of a light-interference effect on an optical film thickness.

The second cap layer 154 is arranged between the first cap layer 152 and the third cap layer 156 and is preferred to have a film thickness of 2 µm or more which is a sufficient film thickness to inhibit the light-interference effect. As demonstrated by the calculation result of FIG. 3, it has been known that the light intensity after the interference depends on a gap (optical film thickness) of the microcavity, and the interference effect decreases as the gap becomes larger to eventually inhibit observation of the interference effect. Furthermore, since a film located over the second cap layer 154, e.g., the third cap layer 156, is arranged to extend over the second cap 154, there is a possibility that the third cap layer 156 or a film located over the third cap layer 156 is disconnected due to a step caused by the films located thereunder. Thus, it is preferred that the second cap layer 154 does not have an unnecessarily large film thickness. For example, the film thickness of the second cap layer 154 is preferred to be equal to or less than 10 µm.

A refractive index of the second cap layer 154 may be the same as or less than that of the first cap layer 152. This configuration reduces reflectance at an interface between the first cap layer 152 and the second cap layer 154 for the light directed from the first cap layer 152 to the second cap layer 154 and prevents the resonance in the first cap layer 152. In other words, the light directed from the first cap layer 152 to the second cap layer 154 can be effectively introduced into the second cap layer 154.

More specifically, the second cap layer 154 may contain the material usable in the first cap layer 152. Alternatively, the second cap layer 154 may include a polymer material or an inorganic material having the same or substantially the same refraction index as the first cap layer 152. The polymer material may be a thermoplastic resin or a resin which is crosslinked and cured by heating or light irradiation. As a resin, an acrylic resin, an epoxy resin, a resin having a polyimide, a polyamide, a polyester, a polycarbonate, or a polysiloxane as a basic skeleton, and the like are represented. The use of the aforementioned materials and the selection of the film thickness of the second cap layer 154 from the aforementioned range prevents the resonance in the first cap layer 152 and the second cap layer 154, by which the light radiated from the light-emitting element 120 can be supplied outside while maintaining the spectrum shape and the intensity thereof.

5. Control of Emission by Optical Adjustment Layer

Figure 4:
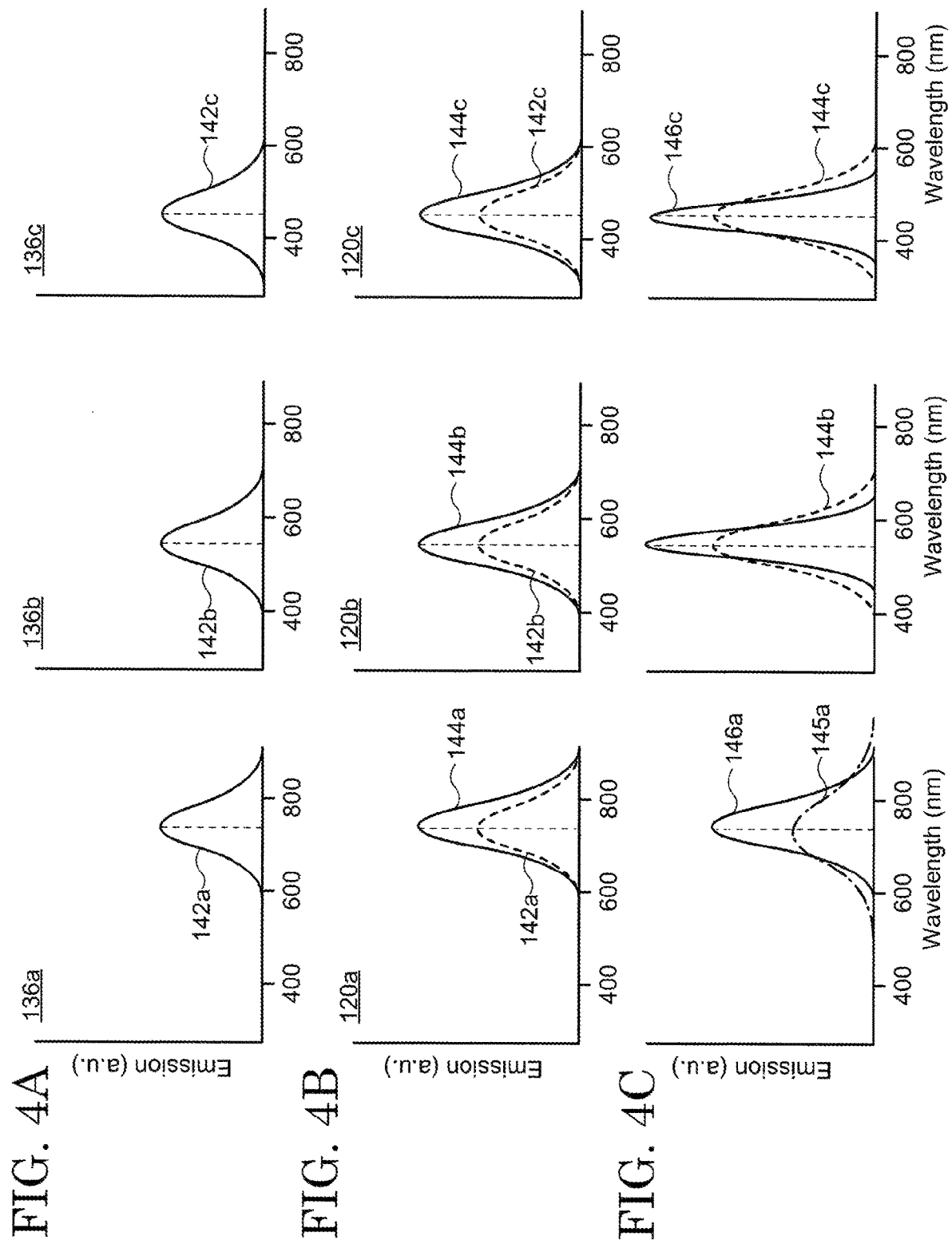
FIG. 4A to FIG. 4C are diagrams showing emission behavior of a display device according to an embodiment of the present invention.

The use of the optical adjustment layer 150 with the aforementioned structure allows production of the display device 100 with excellent color purity and high efficiency. For example, when the pixels 102a, 102b, and 102c have the red-, green-, and blue-emissive emission layers 136a, 136b, and 136c, respectively, the emission layers 136a, 136b, and 136c give emission spectra (142a, 142b, and 142c) in a red region (e.g., 610 nm to 750 nm), a green region (e.g., 500 nm to 600 nm), and a blue region (e.g., 400 nm to 480 nm), respectively, as shown in FIG. 4A. The emission peak wavelengths are also located in the aforementioned regions, respectively.

As described above, the optical adjustment in each light-emitting element 120 allows each spectrum to be narrowed and emission luminance in the front direction of the display device 100 to be increased. For example, as shown in FIG. 4B, the full-width half-maximum and intensity of the spectra 142a, 142b, and 142c are decreased and the intensity thereof is increased. As a result, the light-emitting elements 120a, 120b, and 120c provide the light emission with the spectra 144a, 144b, and 144c, respectively. Note that the optical adjustment in each light-emitting element 120 is arbitrarily conducted.

Here, as shown in FIG. 2, when the emission regions of the pixels 102b and 102c are not covered by the second cap layer 154, the light emission of the light-emitting elements 120 in the pixels 102b and 102c can be further optically adjusted with the first cap layer 152. Accordingly, as demonstrated by the middle and right diagrams of FIG. 4C, the emission spectra of the light-emitting elements 120b and 120c are further narrowed, and the intensity thereof is increased (spectra 146b and 146c).

Current efficiency is generally the lowest in a light-emitting element giving blue color. Additionally, since a phosphorescent material giving blue emission with high color purity is extremely limited, a light-emitting element giving blue color exhibits the lowest quantum efficiency. Therefore, an optical adjustment layer arranged outside a light-emitting element is usually designed so that blue light is amplified in order to reinforce the low efficiency. In this case, an optical film thickness of the optical adjustment layer will be 120 nm, 360 nm, 600 nm, or the like if a wavelength of light to be amplified is 480 nm. However, red light (e.g., 720 nm) is attenuated when the optical film thickness of the optical adjustment layer is 360 nm, and intensity thereof is significantly decreased. Thus, when the optical adjustment layer is designed so that light emission with a short wavelength is amplified, light emission with a long wavelength may be significantly reduced. Therefore, the first cap layer 152 is not always capable of amplifying the light emission from the light-emitting element 120 in the pixel 120a covered by the second cap layer 154. Additionally, when the second cap layer 154 is not provided in the pixel 102a, the light emission is attenuated, and the spectrum thereof becomes broad, resulting in a tendency to decrease the intensity (spectrum 145a).

However, in the display device 100, the second cap layer 154 is disposed over the light-emitting element 120a giving the light emission with a long wavelength so that the resonance is inhibited in the first cap layer 152 and the second cap layer 154. Hence, it is possible to extract the light emission from the light-emitting element 120a while maintaining the spectrum shape and the intensity thereof (spectrum 146a). Accordingly, the color purity of the light radiated by the light-emitting element 120a is maintained, and the efficiency does not decrease.

Therefore, application of the present embodiment allows each pixel 102 to provide light emission with excellent color purity and high efficiency. As a result, a display device capable of displaying an image with high display quality can be provided.

6. Other Structures

As shown in FIG. 2, the display device 100 may further have a sealing film (hereinafter, referred to as a passivation film) 160 over the optical adjustment layer 150. The passivation film 160 has a function to prevent impurities such as water and oxygen from entering the light-emitting element 120 from outside, thereby improving reliability of the light-emitting element 120. The structure of the passivation film 160 can be arbitrarily determined, and the passivation film 160 may have a three-layer structure as shown in FIG. 2, for example. In this case, the passivation film 160 may have a first layer 162, a second layer 164, and a third layer 166. The first layer 162 and the third layer 166 may include an inorganic compound, and the second layer 164 may contain an organic compound, for example. Silicon nitride and silicon oxide can be used for the first layer 162 and the third layer 166, for example. The second layer 164 can be formed at a thickness so that depressions and projections caused by the partition wall 116 and the like are absorbed and a flat surface is provided.

The opposing substrate 112 may be provided over the passivation film 160 via a filler 170. Thus, the filler 170 also functions as an adhesive. The display device 100 including the light-emitting element 120 is physically protected by the opposing substrate 112. Although not illustrated, the opposing substrate 112 may be provided with a color filter, a light-shielding film, an overcoat protecting the color filter and the light-shielding film, and the like. The opposing substrate 112 may be a flexible resin film or a circularly polarizing plate.

Second Embodiment

In the present embodiment, a display device 200 having a structure different from that of the display device 100 is explained. Explanation of the structures the same as those of the First Embodiment may be omitted.

Figure 5:
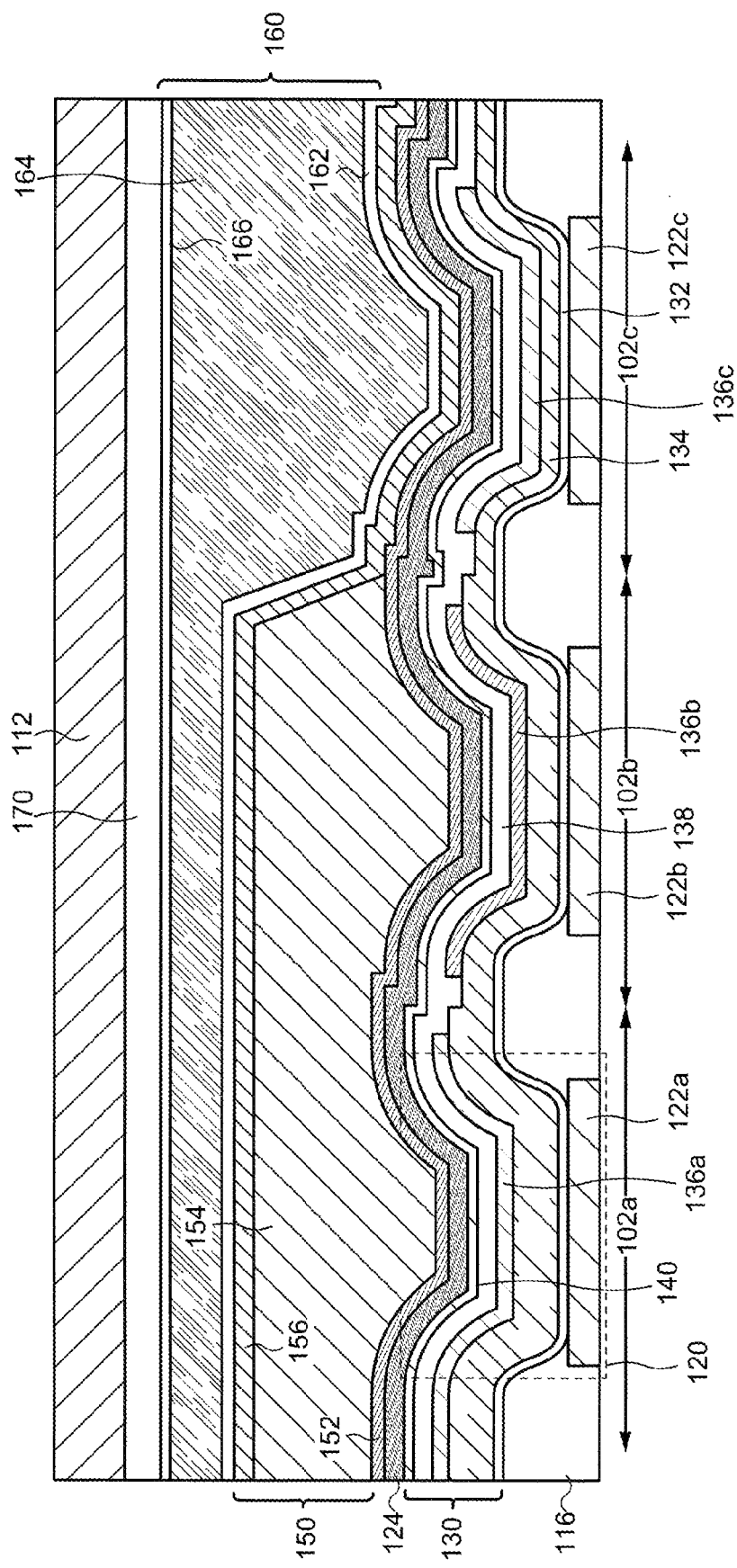
FIG. 5 is a schematic cross-sectional view of a display device according to an embodiment of the present invention.

A schematic cross-sectional view of the display device 200 is shown in FIG. 5. Three pixels 102a, 102b, and 102c are illustrated in FIG. 5. The pixel 102b is adjacent to the pixels 102a and 102c and sandwiched therebetween. The pixels 102a, 102b, and 102c may have the emission layers 136a, 136b, and 136c giving emission colors different from one another. As shown in FIG. 5, the display device 200 is different from the display device 100 in that the EL layers 130 or their emission regions of two pixels with different emission colors (pixels 102a and 102b in FIG. 5) are covered by the first cap layer 152, the second cap layer 154, and the third cap layer 156 and that the first cap layer 152 and the third cap layer 156 are in contact with each other over the EL layer 130 or its emission region of the pixel (pixel 102c in FIG. 5) giving an emission color different from those of the pixels 102a and 102b. In this case, the pixels 102a and 102b whose emission regions are covered by the first cap layer 152, the second cap layer 154, and the third cap layer 156 may be adjacent to each other as shown in FIG. 5.

For example, when the first cap layer 152 is able to amplify the light emission from the light-emitting element 120 of one pixel 102c but unable to amplify the light emission from the light-emitting elements 120 of the other two pixels 102a and 102b, the use of the structure of the display device 200 makes it possible to prevent a decrease in color purity and intensity of the light emission from the pixels 102a and 102b. As a result, the light emission with excellent color purity is efficiently attained from each pixel 102, and a display device capable of displaying an image with high display quality can be provided.

Third Embodiment

In the present embodiment, a display device 300 having a structure different from those of the display devices 100 and 200 is explained. Explanation of the structures the same as those of the First and Second Embodiments may be omitted.

Figure 6:
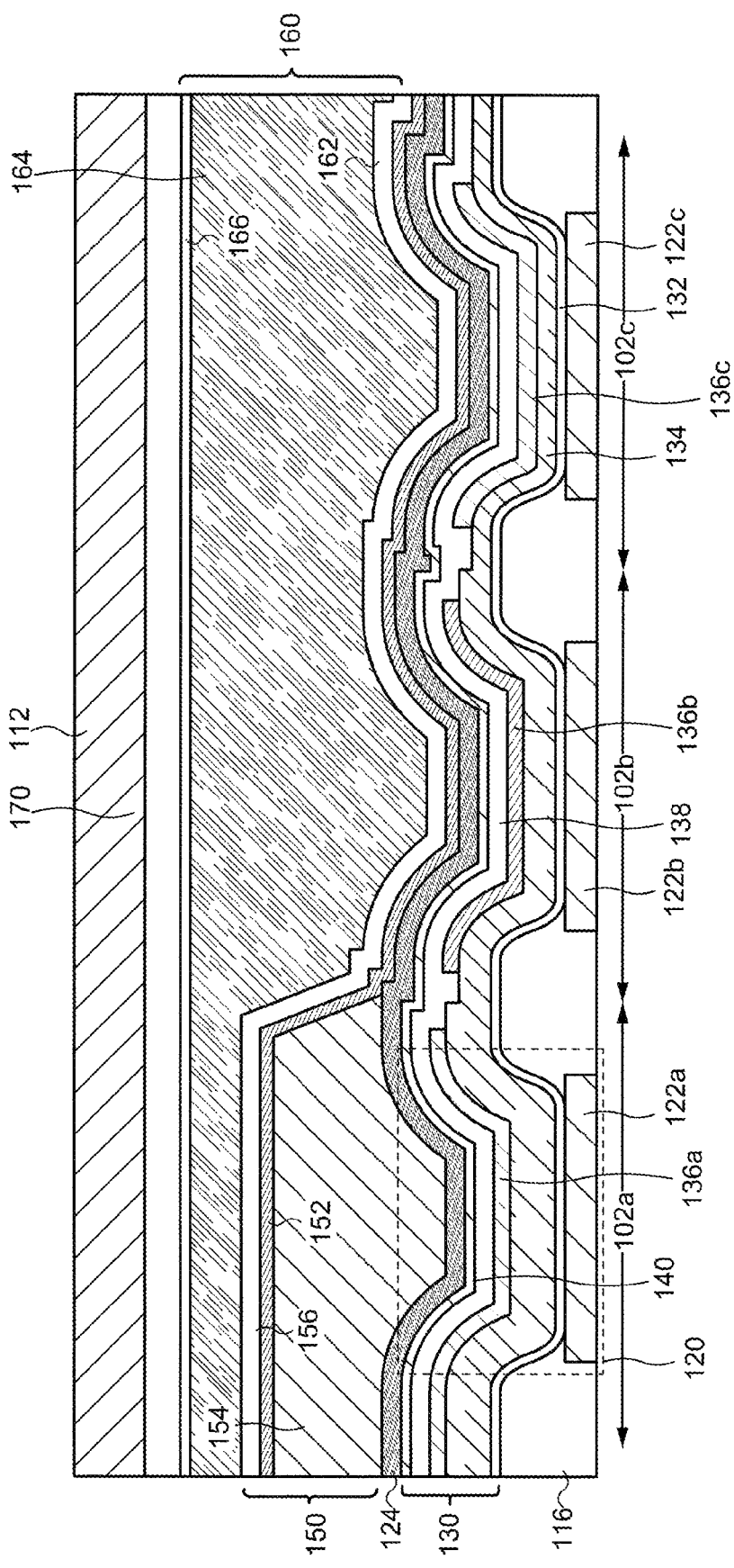
FIG. 6 is a schematic cross-sectional view of a display device according to an embodiment of the present invention.

A schematic cross-sectional view of the display device 300 is shown in FIG. 6. The display device 300 is different from the display devices 100 and 200 in the vertical relationship between the first cap layer 152 and the second cap layer 154. Specifically, the optical adjustment layer 150 of the display device 300 possesses the second cap layer 154 over the second electrode 124, the first cap layer 152 over the second cap layer 154, and the third cap layer 156 over the first cap layer 152. Similar to the display device 100, the second cap layer 154 overlaps with the EL layers 130 or their emission regions of a part of the pixels 102 (pixel 102a in FIG. 6) but does not overlap with the EL layers 130 or their emission regions of another part of the pixels 102 (pixels 102b and 102c in FIG. 6). Therefore, the first cap layer 152 and the second electrode 124 are not in contact with each other over the emission region in the pixel in which the EL layer 130 or its emission region overlaps with the second cap layer 154. Moreover, the first cap layer 152 is spaced from the third cap layer 156 with the second cap layer 154 therebetween. On the other hand, the first cap layer 152 and the third cap layer 156 are in contact with each other over the emission regions of all of the pixels 102.

As described above, the second cap layer 154 may contain a material whose refractive index is the same as or close to that of the first cap layer 152. Therefore, the reflection at the interface between the second cap layer 154 and the first cap layer 152 is suppressed. As a result, the light interference is inhibited in the first cap layer 152 over the pixel 102a in which the emission region overlaps with the second cap layer 154, and the spectrum shape and intensity of the light emission from the light-emitting element 120 are substantially maintained. On the other hand, in the pixels 102b and 102c in which the emission regions do not overlap with the second cap layer 154, the light emission is amplified in the first cap layer 152, leading to an improvement of the color purity and intensity. Hence, the light emission with excellent color purity is efficiently attained from each pixel 102, and a display device capable of displaying an image with high display quality can be provided.

Fourth Embodiment

In the present embodiment, a manufacturing method of the display device 100 according to the present invention is explained. Explanation of the structures the same as those of the First to Third Embodiments may be omitted.

Figure 7:
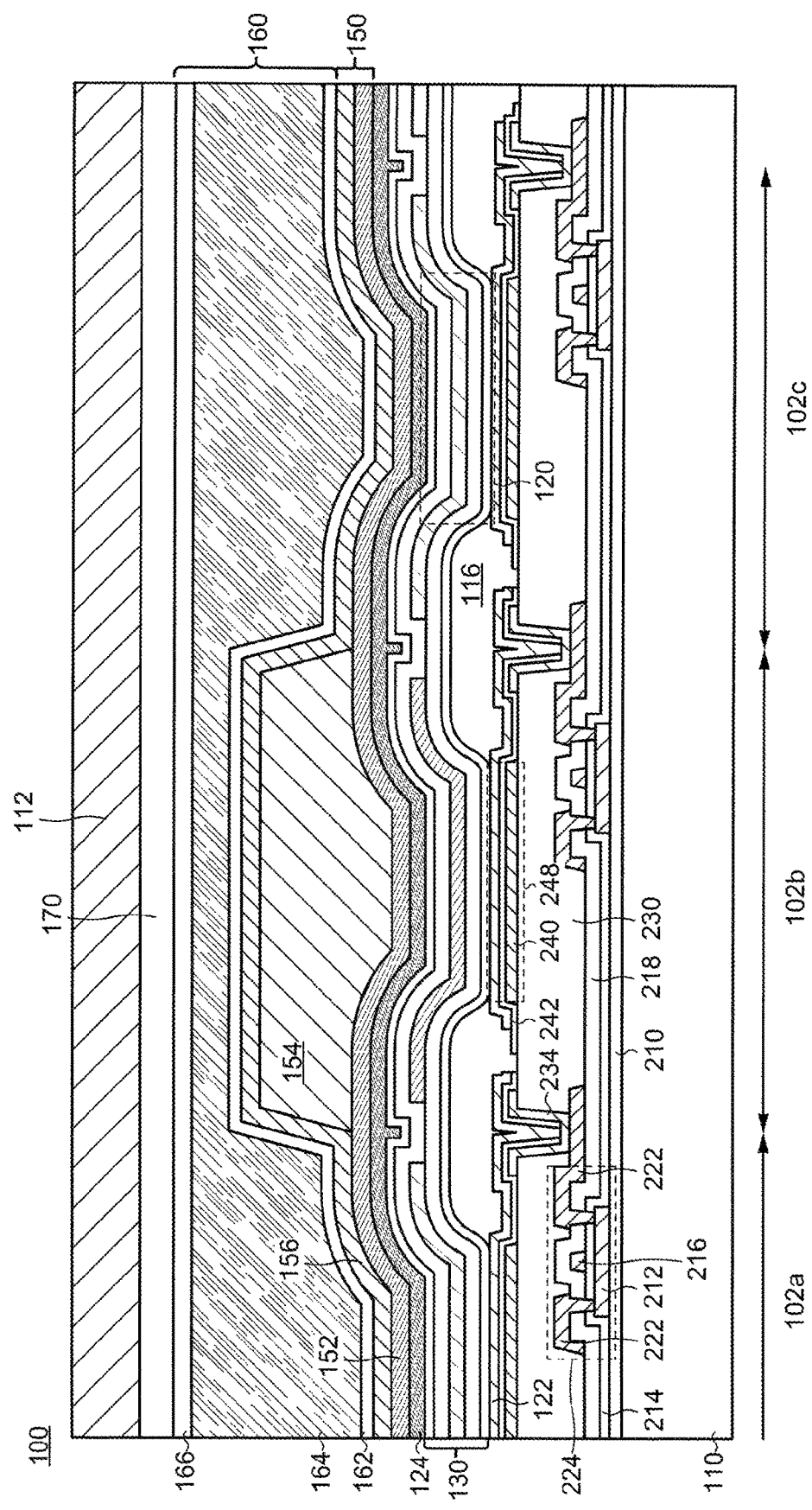
FIG. 7 is a schematic cross-sectional view of a display device according to an embodiment of the present invention.

FIG. 7 shows a schematic cross-sectional view of the display device 100 including three continuously arranged pixels 102a, 102b, and 102c. Here, an example is demonstrated where the emission region of the pixel 102b overlaps with the second cap layer 154, and the first cap layer 152 and the third cap layer 156 are in contact with each other over the emission regions of the pixels 102a and 102c.

The pixels 102 including the plurality of pixels 102a, 102b, and 102c each possess, over the substrate 110, elements such as a transistor 224, the light-emitting element 120 electrically connected to the transistor 224, and a supplementary capacitor 248 through a base film 210. FIG. 7 shows an example in which one transistor 224 and one supplementary capacitor 248 are disposed in each pixel 102. However, each pixel 102 may have a plurality of transistors and a plurality of capacitor elements. The structure of the light-emitting element 120 is the same as that described in the First Embodiment. Hereinafter, a manufacturing method of the display device 100 is explained with reference to the schematic cross-sectional views thereof.

1. Transistor

First, as shown in FIG. 8A, the base film 210 is formed over the substrate 110. The substrate 110 has a function to support semiconductor elements included in the display region 104, such as the transistor 224, the light-emitting element 120, and the like. Therefore, a material having heat resistance to a process temperature of a variety of elements formed thereover and chemical stability to chemicals used in the process may be used for the substrate 110. Specifically, the substrate 110 may include glass, quartz, plastics, a metal, ceramics, and the like.

When flexibility is provided to the display device 100, a base material is formed over the substrate 110. In this case, the substrate 110 may be called a supporting substrate. The base material is an insulating film with flexibility and may include a material selected from a polymer material exemplified by a polyimide, a polyamide, a polyester, and a polycarbonate. The base material can be formed by applying a wet-type film-forming method such as a printing method, an ink-jet method, a spin-coating method, and a dip-coating method or a lamination method.

The base film 210 is a film having a function to prevent impurities such as an alkaline metal from diffusing to the transistor 224 and the like from the substrate 110 (and the base material) and may include an inorganic insulator such as silicon nitride, silicon oxide, silicon nitride oxide, and silicon oxynitride. The base film 210 can be formed to have a single-layer or stacked-layer structure by applying a chemical vapor deposition method (CVD method), a sputtering method, or the like. When an impurity concentration in the substrate 110 is low, the base film 210 may not be provided or may be formed to cover a part of the substrate 110.

Next, a semiconductor film 212 is formed (FIG. 8A). The semiconductor film 212 may contain Group 14 elements such as silicon. Alternatively, the semiconductor film 212 may include an oxide semiconductor. As an oxide semiconductor, Group 13 elements such as indium and gallium are represented. For example, a mixed oxide of indium and gallium (IGO) may be used. When an oxide semiconductor is used, the semiconductor film 212 may further contain a Group 12 element, and a mixed oxide of indium, gallium, and zinc (IGZO) is exemplified. Crystallinity of the semiconductor film 212 is not limited, and the semiconductor film 212 may include a crystal state of a single crystalline, polycrystalline, microcrystalline, or amorphous state.

When the semiconductor film 212 includes silicon, the semiconductor film 212 may be prepared with a CVD method by using silane gas and the like as a raw material. A heat treatment or application of light such as a laser may be performed on amorphous silicon obtained to conduct crystallization. When the semiconductor film 212 includes an oxide semiconductor, the semiconductor film 212 can be formed by utilizing a sputtering method or the like.

Next, a gate insulating film 214 is prepared so as to cover the semiconductor film 212 (FIG. 8A). The gate insulating film 214 can also be prepared with an inorganic compound containing silicon, such as silicon oxide and silicon nitride, by using the same method as the base film 210. The gate insulating film 214 may have a single-layer structure or a stacked-layer structure.

Next, a gate electrode 216 is formed over the gate insulating film 214 with a sputtering method or a CVD method (FIG. 8B). The gate electrode 216 may be formed with a metal such as titanium, aluminum, copper, molybdenum, tungsten, tantalum or an alloy thereof so as to have a single-layer or stacked-layer structure. For example, a structure in which a highly conductive metal such as aluminum and copper is sandwiched by a metal with a relatively high melting point, such as titanium, tungsten, and molybdenum, can be employed.

Next, an interlayer film 218 is formed over the gate electrode 216 (FIG. 8B). The interlayer film 218 may have a single-layer or stacked layer structure, may include an inorganic insulator such as silicon nitride, silicon oxide, silicon nitride oxide, and silicon oxynitride, and may be prepared with the same method as that of the base film 210. When the interlayer film 218 has a stacked structure, a layer including an inorganic compound may be stacked after forming a layer including an organic compound, for example. After that, doping may be conducted on the semiconductor film 212 to form source/drain regions.

Next, etching is performed on the interlayer film 218 and the gate insulating film 214 to form openings 220 reaching the semiconductor film 212 (FIG. 8C). The openings 220 can be prepared, for example, by conducting plasma etching in a gas including a fluorine-containing hydrocarbon.

Figure 9A:
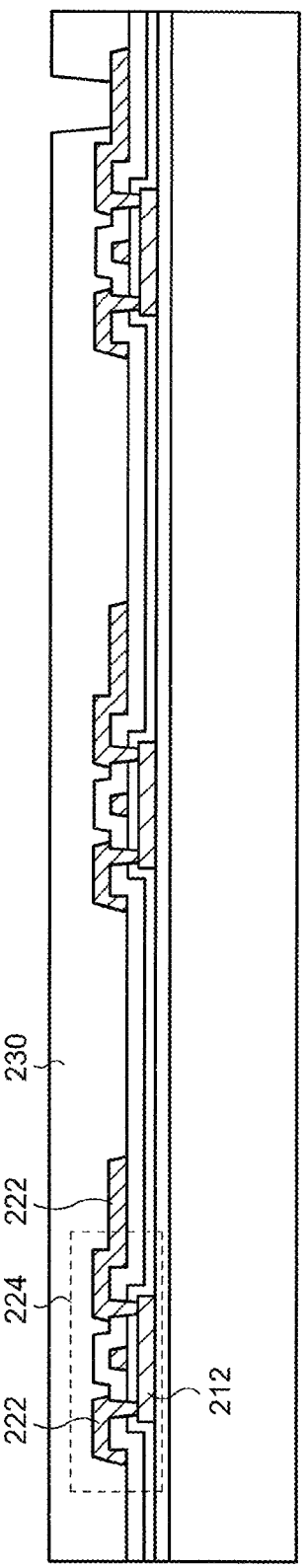
FIG. 9A to FIG. 9C are schematic cross-sectional views for explaining a manufacturing method of a display device according to an embodiment of the present invention.

Next, a metal film is formed to cover the openings 220 and processed with etching to form source/drain electrodes 222 (FIG. 9A). Similar to the gate electrode 216, the metal film may include a metal such as titanium, aluminum, copper, molybdenum, and tantalum or an alloy thereof and may have a single-layer or stacked layer structure. The metal film can be formed with a method similar to that of the gate electrode 216. Through the aforementioned processes, the transistor 224 is fabricated. In the present embodiment, the transistor 224 is illustrated as a top-gate type transistor. However, there is no limitation to the structure of the transistor 224, and the transistor 224 may be a bottom-gate type transistor, a multi-gate type transistor having a plurality of gate electrodes 216, or a dual-gate type transistor having a structure in which the semiconductor film 212 is sandwiched by two gate electrodes 216. Moreover, there is no limitation to a vertical relationship between the source/drain electrodes 222 and the semiconductor film 212.

2. Supplementary Capacitor and Light-Emitting Element

Next, a leveling film 230 is formed so as to cover the transistor 224 (FIG. 9A). The leveling film 230 has a function to absorb depressions, projections, and inclinations caused by the transistor 224 and the like and provide a flat surface. The leveling film 230 can be prepared with an organic insulator. As an organic insulator, a polymer material such as an epoxy resin, an acrylic resin, a polyimide, a polyamide, a polyester, a polycarbonate, and a polysiloxane is represented. The leveling film 230 can be formed with the aforementioned wet-type film-forming method and the like.

Figure 9B:
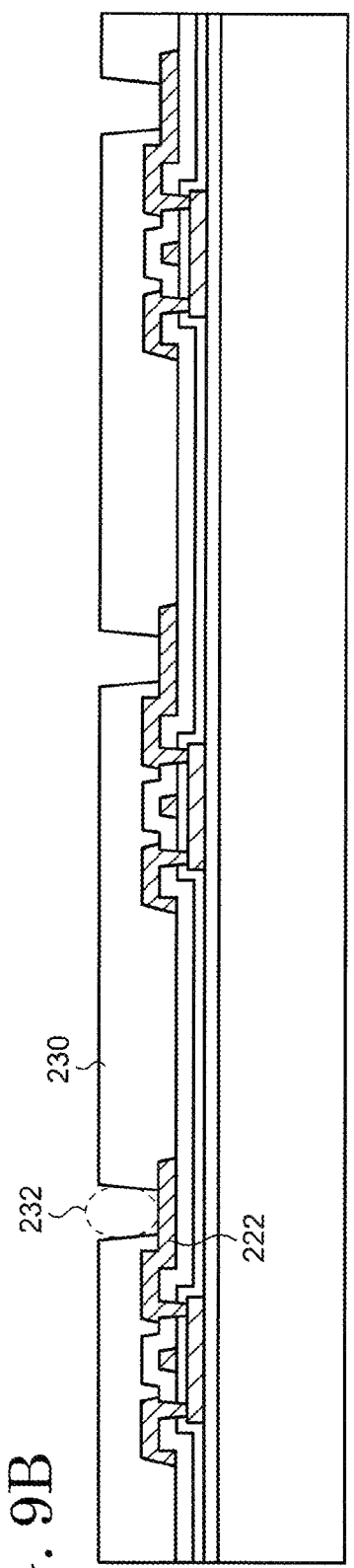
Figure 9C:
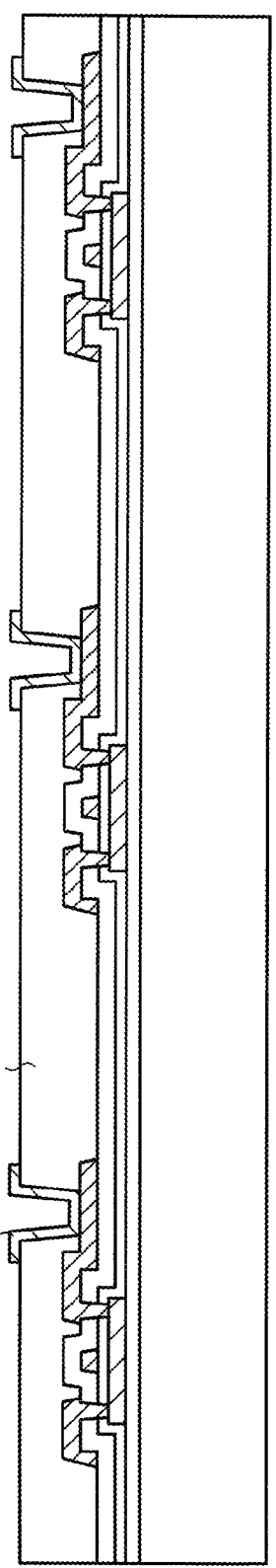

After that, etching is performed on the leveling film 230 to form an opening 232 exposing one of the source/drain electrodes 222 (FIG. 9B). After that, a connection electrode 234 is prepared so as to cover this opening 232 and be in contact with one of the source/drain electrodes 222 of the transistor 224 (FIG. 9C). The connection electrode 234 may be formed by using a conductive oxide transmitting visible light, such as indium-tin oxide (ITO) and indium-zinc oxide (IZO), with a sputtering method or the like. Note that formation of the connection electrode 234 is optional. Deterioration of a surface of the source/drain electrode 222 can be avoided in the following processes by forming the connection electrode 234, by which generation of contact resistance between the source/drain electrode 222 and the pixel electrode 122 can be suppressed.

Figure 10A:
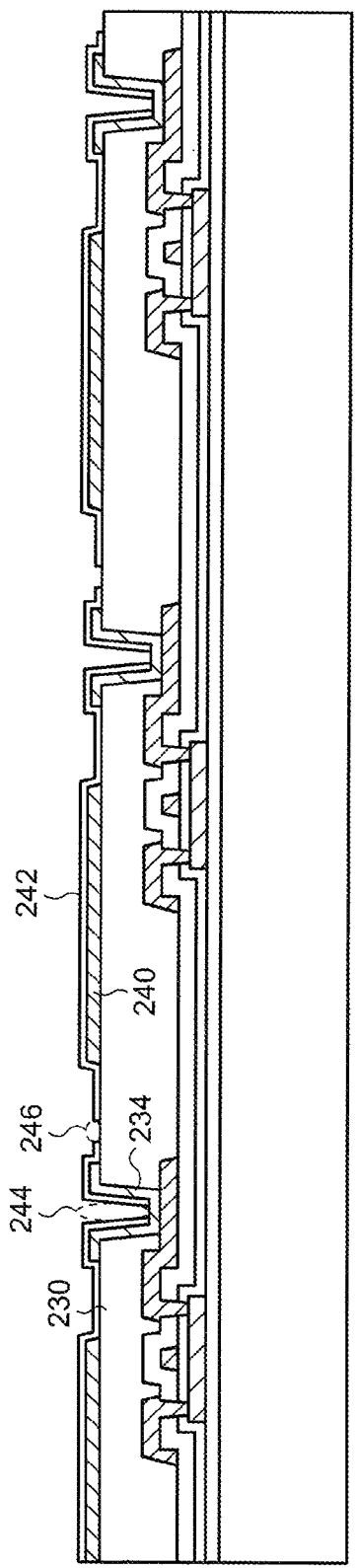
FIG. 10A and FIG. 10B are schematic cross-sectional views for explaining a manufacturing method of a display device according to an embodiment of the present invention.

Next, a metal film is formed over the leveling film 230 and processed with etching to form one of electrodes 240 of the supplementary capacitor 248 (FIG. 10A). Similar to the conductive film used for the formation of the source/drain electrodes 222, the metal film used here may have a single layer structure or a stacked layer structure, and a three-layer structure of molybdenum/aluminum/molybdenum may be employed, for example.

Next, an insulating film 242 is formed over the leveling film 230 and the electrode 240 (FIG. 10A). The insulating film 242 not only functions as a protection film for the transistor 224 but also serves as a dielectric in the supplementary capacitor 248. Therefore, it is preferred to use a material with relatively high permittivity. For example, the insulating film 242 can be formed with silicon nitride, silicon nitride oxide, silicon oxynitride, or the like by applying a CVD method or a sputtering method. Openings 244 and 246 are provided in the insulating film 242 (FIG. 10A). The former is provided for electrical connection between the pixel electrode 122 formed later and the connection electrode 234. The latter is an opening to abstract, through the partition wall 116, water and gas eliminated from the leveling film 230 in a heating process and the like performed after the formation of the partition wall 116.

Figure 10B:
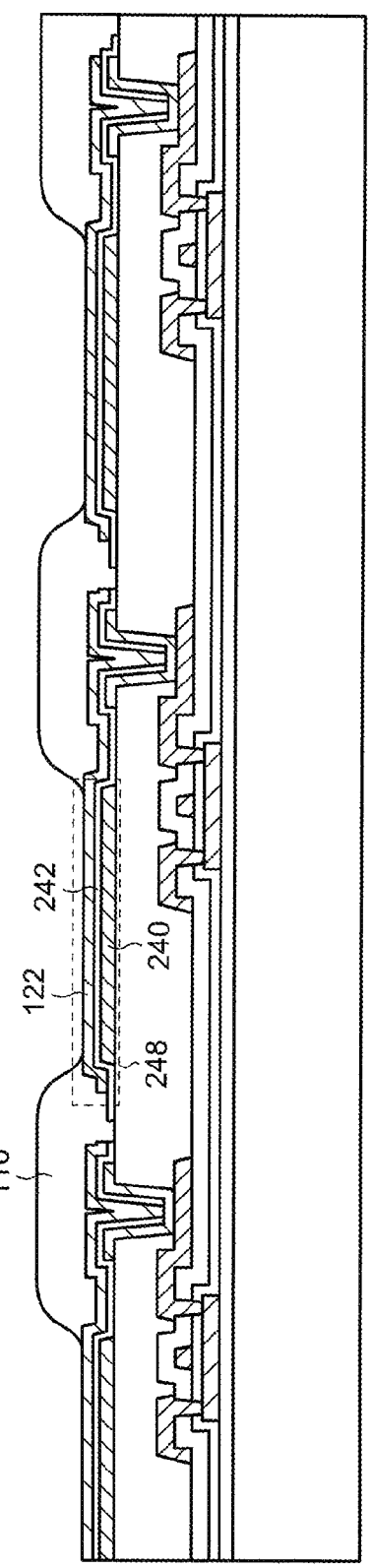

Next, as shown in FIG. 10B, the pixel electrode 122 is prepared so as to cover the opening 244. The supplementary capacitor 248 is formed by the pixel electrode 122, the insulating film 242, and the electrode 240. A potential of the gate electrode 216 of the transistor 224 can be maintained for a longer time by forming the supplementary capacitor 248.

The structure of the pixel electrode 122 is the same as that described in the First Embodiment, and the pixel electrode 122 can be formed by using a sputtering method, a CVD method, or the like.

Next, the partition wall 116 is formed so as to cover the edge portion of the pixel electrode 122 (FIG. 10B). The formation of the partition wall 116 allows steps caused by the pixel electrode 122 and the like to be absorbed and the pixel electrodes 122 of the adjacent pixels 102 to be electrically insulated from each other. The partition wall 116 may be prepared with a wet-type film-forming method by using an epoxy resin, an acrylic resin, or the like.

Next, the EL layer 130 and the second electrode 124 of the light-emitting element 120 are formed so as to cover the pixel electrode 122 and the partition wall 116. The structures of these elements are the same as those described in the First Embodiment. Specifically, the hole-injection layer 132 is first formed to cover the pixel electrode 122 and the partition wall 116, and then the hole-transporting layer 134 is prepared over the hole-injection layer 132 (FIG. 11A). As described above, the hole-injection layer 132 and the hole-transporting layer 134 each may have a single-layer structure or a stacked-layer structure. For example, when the thickness of the hole-transporting layer 134 is changed in every pixel 102 as shown in FIG. 2, the hole-transporting layer 134 in which a plurality of compounds is stacked may be provided in the pixel 102a having the hole-transporting layer 134 with a large thickness, while the hole-transporting layer 134 may have a single-layer structure in the pixel 102b or 102c having the hole-transporting layer 134 with a small thickness.

Next, the emission layer 136 is formed over the hole-transporting layer 134 (FIG. 11B). In the present embodiment, the emission layers 136a, 136b, and 136c which are different in structure or include different materials between the continuously arranged pixels 102a, 102b, and 102c are fabricated. In this case, materials to be included in the respective emission layers 136a, 136b, and 136c are respectively deposited in the pixels 102a, 102b, and 102c by using metal masks. Alternatively, the emission layers 136a, 136b, and 136c may be formed with an ink-jet method.

Figure 12A:
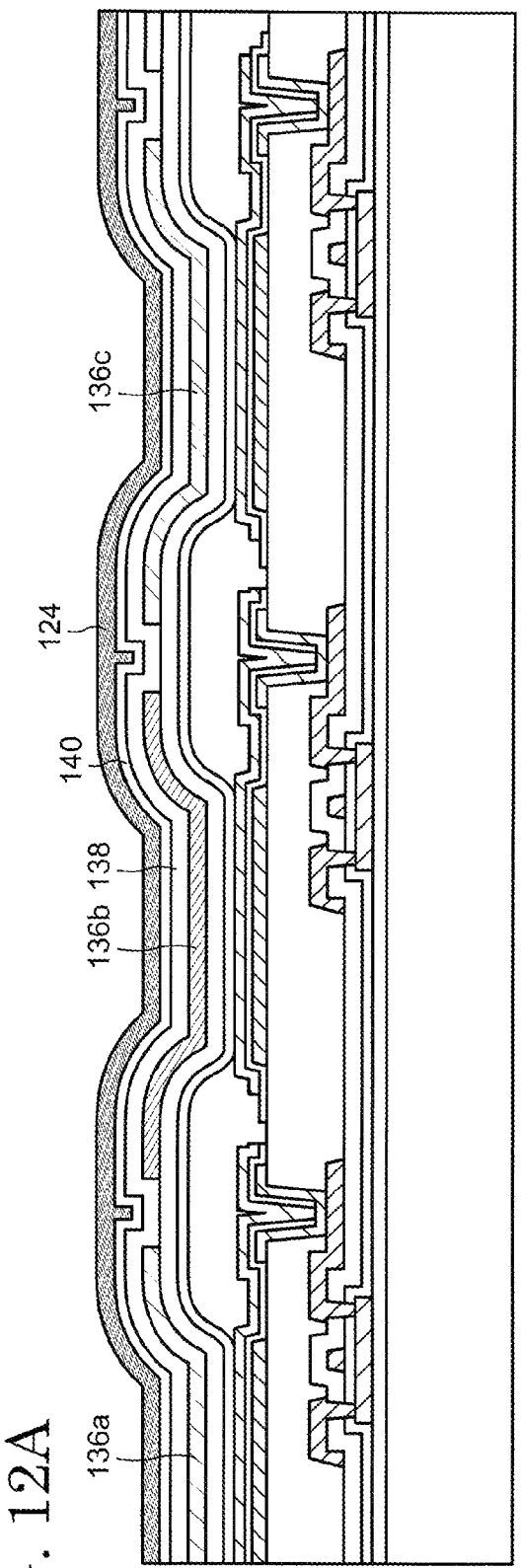
FIG. 12A and FIG. 12B are schematic cross-sectional views for explaining a manufacturing method of a display device according to an embodiment of the present invention.

The electron-transporting layer 138 and the electron-injection layer 140 are successively formed over the emission layer 136, and the second electrode 124 is formed over the electron-injection layer 140 (FIG. 12A). Each layer structuring the EL layer 130 may be formed by applying a wet-type film-forming method or a dry-type film-forming method such as an evaporation method. The second electrode 124 is also prepared by using a sputtering method or an evaporation method. Through these processes, the supplementary capacitor 248 and the light-emitting element 120 are fabricated.

3. Optical Adjustment Layer

Figure 12B:
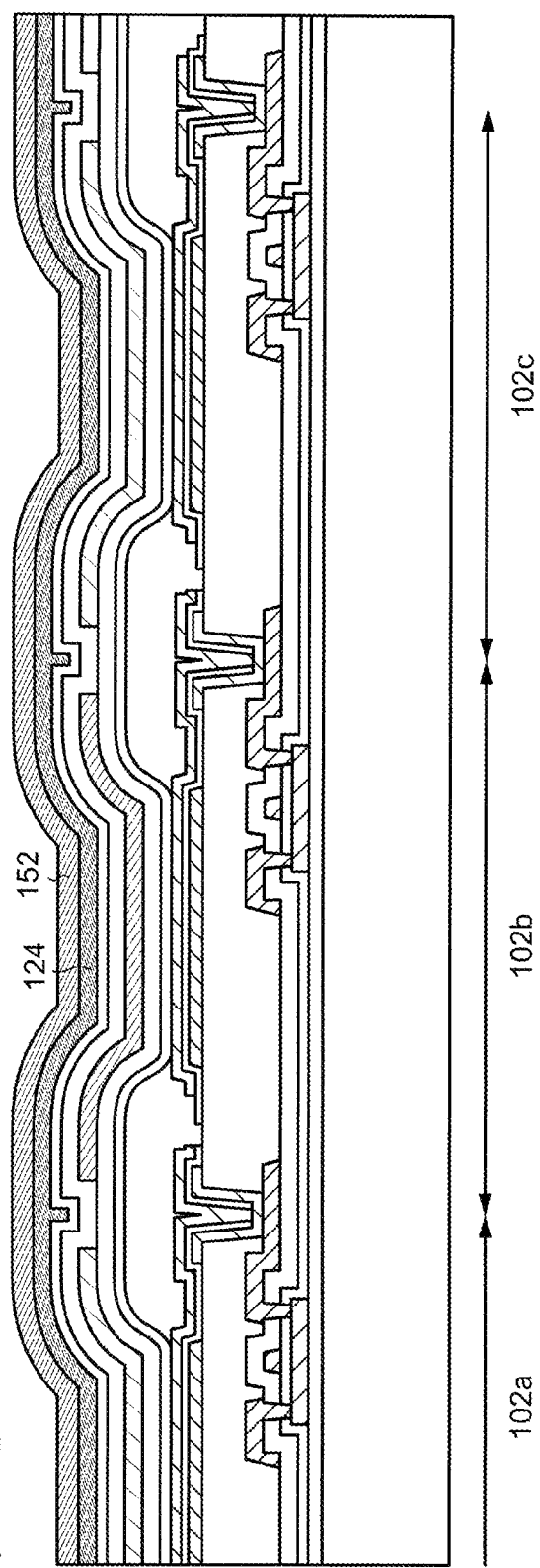
Figure 13:
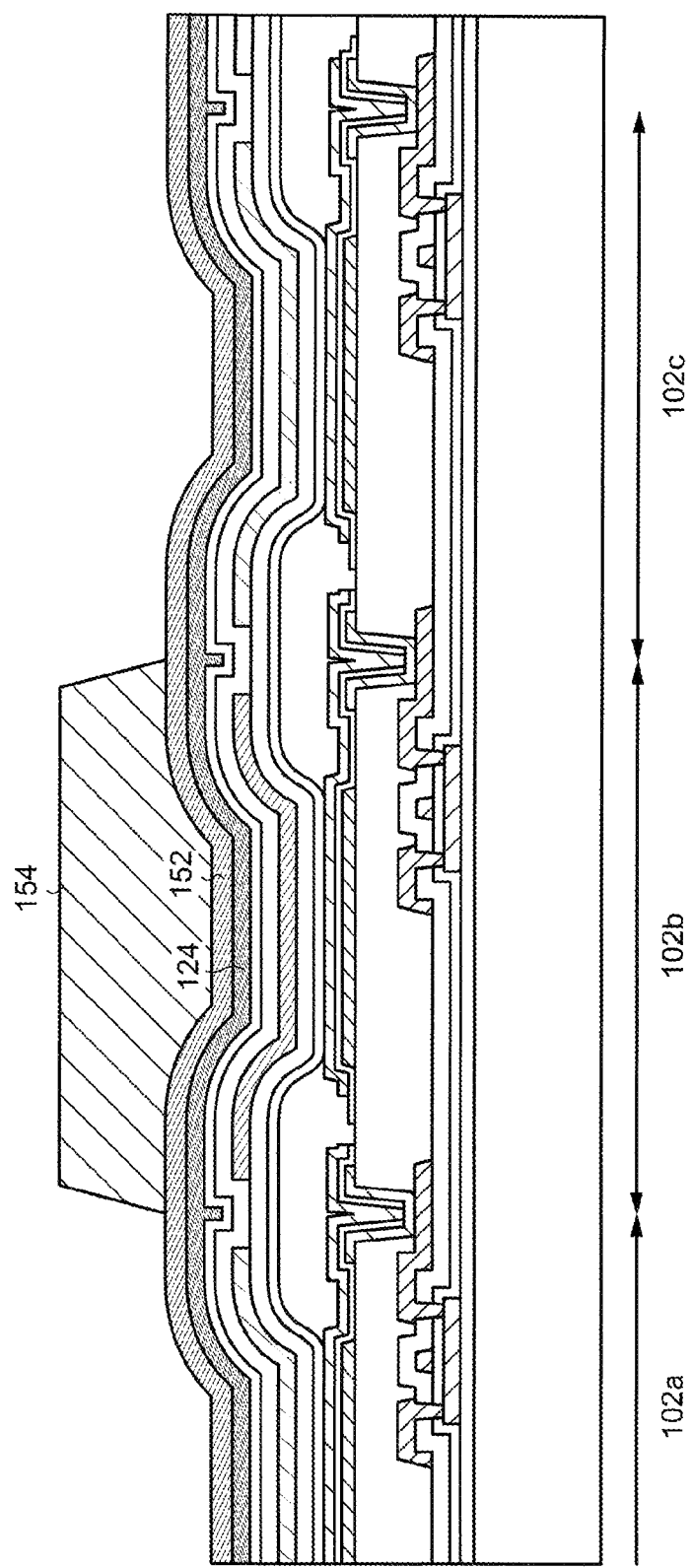
FIG. 13 is a schematic cross-sectional view for explaining a manufacturing method of a display device according to an embodiment of the present invention.
Figure 14:
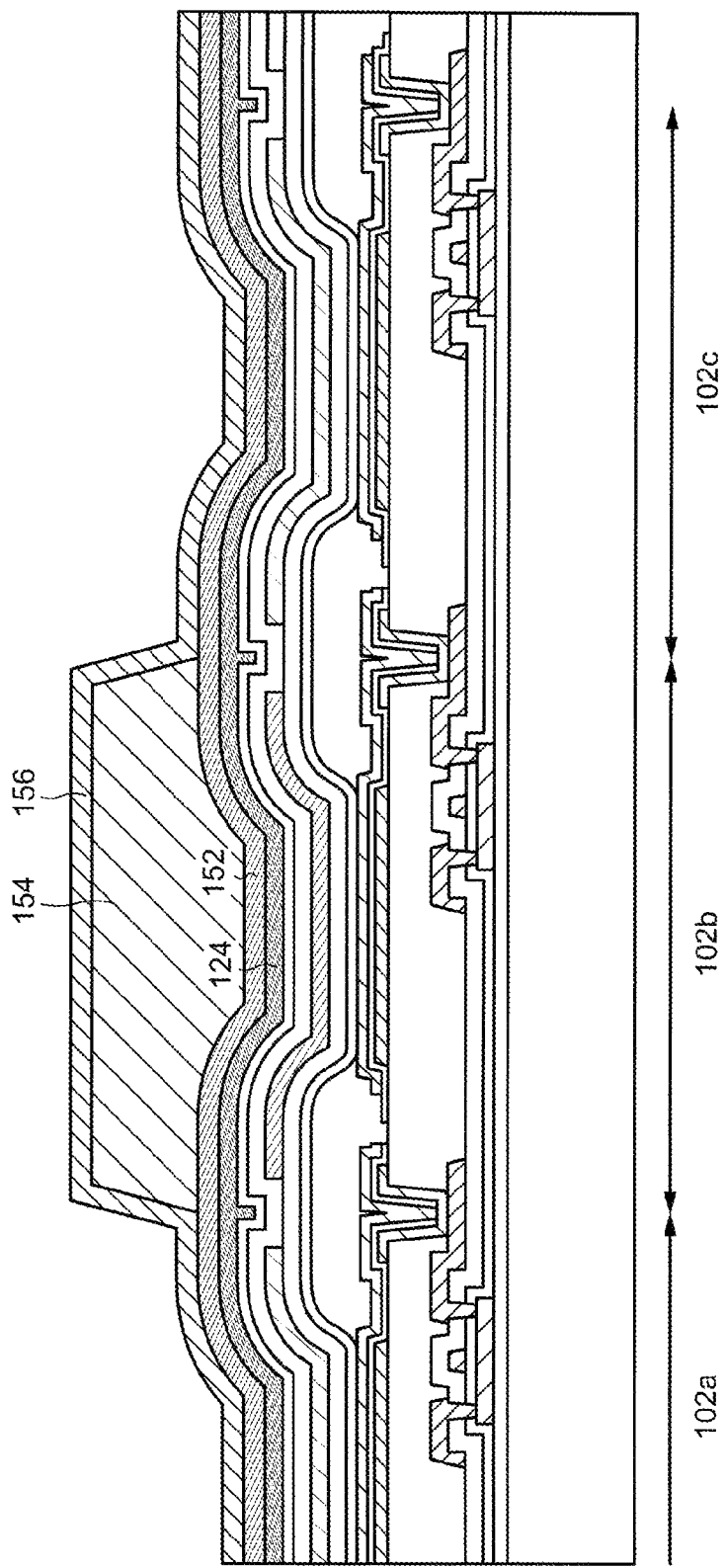
FIG. 14 is a schematic cross-sectional view for explaining a manufacturing method of a display device according to an embodiment of the present invention.

Next, the optical adjustment layer 150 is formed over the second electrode 124. Specifically, the first cap layer 152, the second cap layer 154, and the third cap layer 156 are successively formed (FIG. 12B, FIG. 13, and FIG. 14). These layers may be formed with a wet-type film-forming method or a dry-type film-forming method. Alternatively, an epitaxial growth method or an atomic layer deposition (ALD) method may be applied. The first cap layer 152 and the third cap layer 156 may be formed over all the pixels 102. On the other hand, the second cap layer 154 is selectively formed over the pixels 102 (here, pixel 102b) in which the optical adjustment is not performed on the light extracted from the light-emitting elements 120. The thickness of the second cap layer 154 is larger than those of the first cap layer 152 and the third cap layer 156. Therefore, application of an ink-jet method, a printing method, or the like allows the efficient formation of the second cap layer 154.

4. Passivation Film and Other Structures

Figure 15:
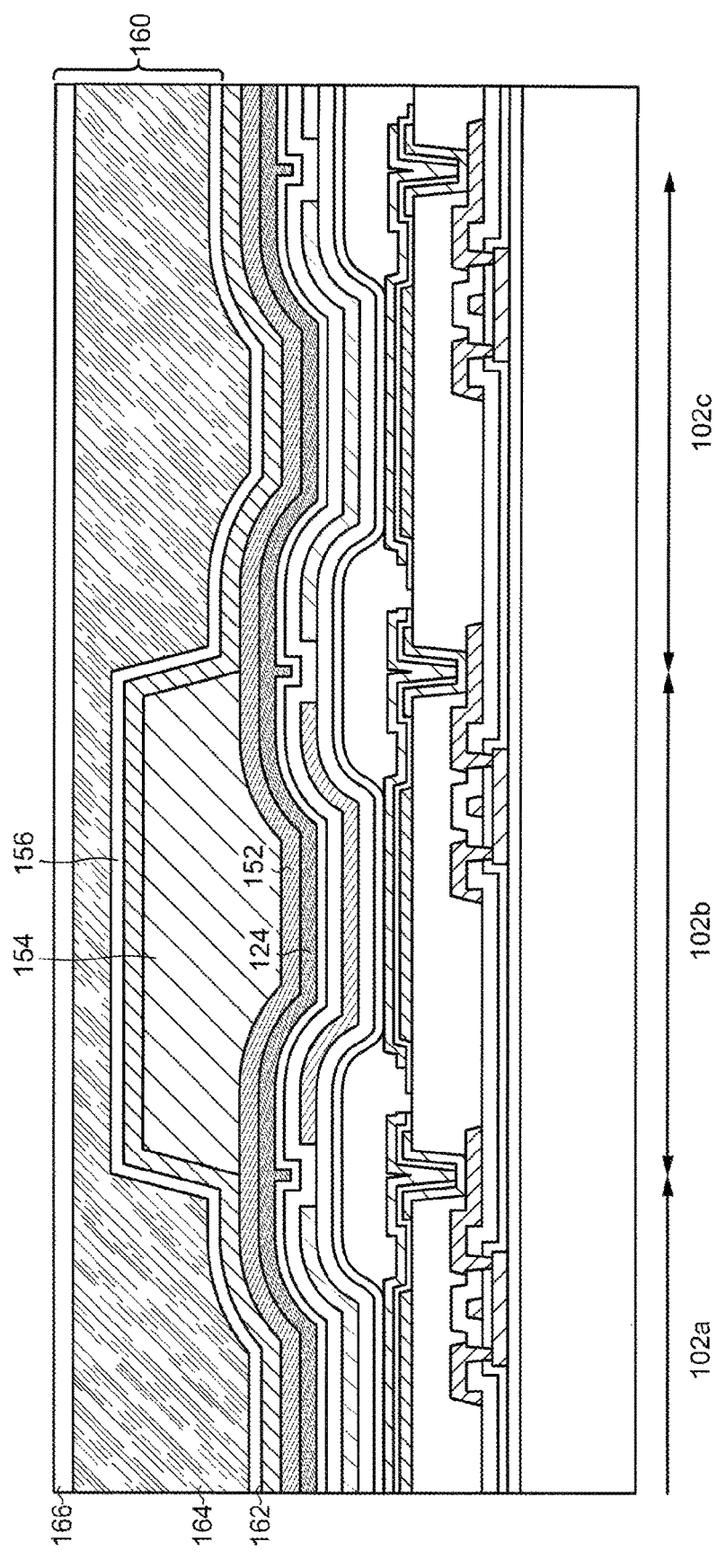
FIG. 15 is a schematic cross-sectional view for explaining a manufacturing method of a display device according to an embodiment of the present invention.

After forming the optical adjustment layer 150, the passivation film 160 is prepared. Specifically, as shown in FIG. 15, the first layer 162 is first formed over the optical adjustment layer 150. The first layer 162 may include an inorganic material such as silicon nitride, silicon oxide, silicon nitride oxide, and silicon oxynitride and may be prepared with a method similar to that of the base film 210.

Next, the second layer 164 is formed. The second layer 164 may contain an organic resin including an acrylic resin, a polysiloxane, a polyimide, a polyester, and the like. As shown in FIG. 15, the second layer 164 may be formed at a thickness so that depressions and projections caused by the partition wall 116 are absorbed and a flat surface is provided. The second layer 164 may be formed by a wet-type film-forming method such as an ink-jet method. Alternatively, the second layer 164 may be prepared by atomizing or vaporizing oligomers serving as a raw material of the aforementioned polymer material at a reduced pressure, spraying the first layer 162 with the oligomers, and then polymerizing the oligomers.

After that, the third layer 166 is formed. The third layer 166 may have the same structure as the first layer 162 and can be formed with the same method as that of the first layer 162. Through these processes, the passivation film 160 is fabricated.

After that, the opposing substrate 112 is fixed through the filler 170 (FIG. 7). The filler 170 may contain a polymer material such as a polyester, an epoxy resin, and an acrylic resin and may be formed by applying a printing method, a lamination method or the like. A desiccant may be included in the filler 170. The opposing substrate 112 may include the same material as the substrate 110. When flexibility is provided to the display device 100, a polymer material such as a polyolefin and a polyimide can be applied for the opposing substrate 112 in addition to the aforementioned polymer materials. In this case, the base material is formed over the substrate 110 as described above, and then the elements such as the transistor 224 and the light-emitting element 120 are fabricated thereover. After that, an interface between the substrate 110 and the base material is irradiated with light such as a laser to reduce adhesion between the substrate 110 and the base material, and then the substrate 110 is physically peeled off, leading to the formation of the flexible display device 100.

Although not shown, a polarizing plate (circularly polarizing plate) may be formed without using the opposing substrate 112. Alternatively, a polarizing plate may be arranged over or under the opposing substrate 112.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising: a first pixel including:
a first pixel electrode;
a first electroluminescent (EL) layer over the first pixel electrode; and a second electrode over the first EL layer; a second pixel adjacent to the first pixel, the second pixel including: a second pixel electrode;
a second EL layer over the second pixel electrode; and the second electrode over the second EL layer; a first cap layer over the second electrode, the first cap layer including a polymer material or an inorganic material containing an element selected from Group 14 elements;
a second cap layer over the first cap layer and overlapping with the first EL layer; and a third cap layer covering the second cap layer, overlapping with the first EL layer and the second EL layer, and in direct contact with the first cap layer in a region overlapping with the second EL layer, wherein
a thickness of the second cap layer is larger than a thickness of the third cap layer in an area overlapping with the first EL layer.

2. The display device according to claim 1, wherein a thickness of the second cap layer is equal to or more than 2 µm and equal to or less than 10 µm.

3. The display device according to claim 1, wherein the second cap layer includes a resin.

4. The display device according to claim 1,
wherein the third cap layer is spaced apart from the first cap layer with the second cap layer sandwiched therebetween over an emission region of the first pixel.

5. The display device according to claim 1, wherein an emission peak wavelength of the first EL layer is different from an emission peak wavelength of the second EL layer.

6. The display device according to claim 1, wherein an emission peak wavelength of the first EL layer is longer than an emission peak wavelength of the second EL layer.

7. The display device according to claim 1, wherein a refractive index of the second cap layer is equal to or less than a refractive index of the first cap layer.

8. The display device according to claim 1,
wherein a sealing film covering a plurality of pixels including the first pixel and the second pixel is arranged over the third cap layer,
the thickness of the second cap layer is larger than a thickness of the sealing film in the area, and
the sealing film includes silicon nitride or silicon oxide.

9. The display device according to claim 8,
wherein the third cap layer includes fluorine, and
the sealing film includes:
an inorganic film in direct contact with the third cap layer; and
an organic film on an opposite side of the inorganic film from the third cap layer and in direct contact with the inorganic film.

10. A display device comprising: a first pixel comprising:
a first pixel electrode;
a first electroluminescent (EL) layer over the first pixel electrode; and a second electrode over the first EL layer; a second pixel adjacent to the first pixel, the second pixel including: a second pixel electrode;
a second EL layer over the second pixel electrode; and the second electrode over the second EL layer; a third pixel adjacent to the second pixel, the third pixel including:
a third pixel electrode;
a third EL layer over the third pixel electrode; and the second electrode over the third EL layer;
a first cap layer over the second electrode, the first cap layer including a polymer material or an inorganic material containing an element selected from Group 14 elements;
a second cap layer over the first cap layer and overlapping with the first EL layer without overlapping with the second EL layer and the third EL layer; and
a third cap layer covering the second cap layer, overlapping with the first EL layer, the second EL layer, and the third EL layer, and in direct contact with the first cap layer in a region overlapping with the third EL layer, wherein
a thickness of the second cap layer is larger than a thickness of the third cap layer in an area overlapping with the first EL layer, and the first EL layer, the second EL layer, and the third EL layer emit lights with colors different from one another.

11. The display device according to claim 10, wherein a thickness of the second cap layer is equal to or more than 2 μm and equal to or less than 10 μm.

12. The display device according to claim 10, wherein the second cap layer includes a resin.

13. The display device according to claim 10,
wherein the third cap layer is spaced apart from the first cap layer with the second cap layer sandwiched therebetween over an emission region of the first pixel.

14. The display device according to claim 13, wherein the third cap layer is in contact with the first cap layer over an emission region of the second pixel.

15. The display device according to claim 13, wherein the second cap layer overlaps with the second EL layer.

16. The display device according to claim 15, wherein the third cap layer is spaced apart from the first cap layer with the second cap layer sandwiched therebetween over the emission region of the second pixel.

17. The display device according to claim 10, wherein an emission peak wavelength of the first EL layer is different from an emission peak wavelength of the second EL layer and an emission peak wavelength of the third EL layer.

18. The display device according to claim 10, wherein an emission peak wavelength of the first EL layer is longer than an emission peak wavelength of the second EL layer and an emission peak wavelength of the third EL layer.

19. The display device according to claim 18, wherein the emission peak wavelength of the second EL layer is longer than the emission peak wavelength of the third EL layer.

20. The display device according to claim 10,
wherein a sealing film covering a plurality of pixels including the first pixel and the second pixel is arranged over the third cap layer,
the third cap layer includes fluorine,
the thickness of the second cap layer is larger than a thickness of the sealing film in the area, and
the sealing film includes:
an inorganic film in direct contact with the third cap layer; and
an organic film on an opposite side of the inorganic film from the third cap layer and in direct contact with the inorganic film.

* * * * *